(12) United States Patent
Fleischer

(10) Patent No.: US 9,017,854 B2
(45) Date of Patent: Apr. 28, 2015

(54) STRUCTURAL ENERGY STORAGE ASSEMBLIES AND METHODS FOR PRODUCTION THEREOF

(75) Inventor: Corey Adam Fleischer, Columbia, MD (US)

(73) Assignee: Applied Nanostructured Solutions, LLC, Baltimore, MD (US)

( * ) Notice: Subject to any disclaimer, the term of this patent is extended or adjusted under 35 U.S.C. 154(b) by 523 days.

(21) Appl. No.: 13/220,597

(22) Filed: Aug. 29, 2011

(65) Prior Publication Data

US 2012/0052363 A1     Mar. 1, 2012

Related U.S. Application Data

(60) Provisional application No. 61/378,378, filed on Aug. 30, 2010.

(51) Int. Cl.
    *H01M 6/42*      (2006.01)
    *H01G 11/26*      (2013.01)
    (Continued)

(52) U.S. Cl.
    CPC ............... *H01G 11/26* (2013.01); *B82Y 30/00* (2013.01); *H01G 9/058* (2013.01); *H01G 9/155* (2013.01);
    (Continued)

(58) Field of Classification Search
    USPC .................. 429/149, 231.8; 29/25.41, 592.1; 361/500, 502; 977/742, 948
    See application file for complete search history.

(56) References Cited

U.S. PATENT DOCUMENTS 2,412,707 A    12/1946   Barnett
3,304,855 A    2/1967   Oebell
(Continued)

FOREIGN PATENT DOCUMENTS

CN    1462767 A    12/2003
CN    1592977 A    3/2005
(Continued)

OTHER PUBLICATIONS

Vaccarini, et al., "Reinforcement of an epoxy resin by single walled nanotubes," AIP Conference Proceedings 2000, <http://dx.doi.org/10.1063/1.1342567>.

(Continued)

*Primary Examiner* — Mark F Huff
*Assistant Examiner* — Monique Wills
(74) *Attorney, Agent, or Firm* — McDermott Will & Emery LLP

(57) ABSTRACT

Described herein are multi-functional composite materials containing energy storage assemblies that can be significantly resistant to tension/compression stress. The energy storage assemblies can contain at least one energy storage layer that contains an insulating layer having a plurality of openings arranged in a spaced apart manner, and a plurality of energy storage devices, each energy storage device being contained within one of the openings. The energy storage devices can be electrically connected to one another. The energy storage layer can contain a support material upon which electrical connections are formed. One or more energy storage layers can be disposed between two or more stress carrying layers to form an energy storage assembly that can have significant resistance to tension/compression stress. Energy storage devices suitable for use in the energy storage assemblies can include, for example, batteries, capacitors and/or supercapacitors. Methods for producing the energy storage assemblies are also described.

25 Claims, 5 Drawing Sheets

(51) Int. Cl.

| | | |
|---|---|---|
| *B82Y 30/00* | (2011.01) | |
| *H01G 9/04* | (2006.01) | |
| *H01G 9/00* | (2006.01) | |
| *H01G 11/10* | (2013.01) | |
| *H01G 11/36* | (2013.01) | |
| *H01G 11/78* | (2013.01) | |
| *H01M 2/10* | (2006.01) | |
| *H01M 2/14* | (2006.01) | |
| *H01M 2/20* | (2006.01) | |
| *H05K 1/18* | (2006.01) | |

(52) U.S. Cl.
CPC .............. *H01G 11/10* (2013.01); *H01G 11/36* (2013.01); *H01G 11/78* (2013.01); *H01M 2/1061* (2013.01); *H01M 2/14* (2013.01); *H01M 2/204* (2013.01); *H05K 1/181* (2013.01); *H05K 2201/10037* (2013.01); *Y02E 60/13* (2013.01)

(56) References Cited

U.S. PATENT DOCUMENTS

| | | |
|---|---|---|
| 3,584,758 A | 6/1971 | Moore |
| 3,871,834 A | 3/1975 | Kuniya et al. |
| 4,104,083 A | 8/1978 | Hirano |
| 4,515,107 A | 5/1985 | Fournier et al. |
| 4,530,750 A | 7/1985 | Alsenberg et al. |
| 4,566,969 A | 1/1986 | Klein |
| 4,707,349 A | 11/1987 | Hjersted |
| 4,728,399 A | 3/1988 | Moehwald |
| 4,837,073 A | 6/1989 | McAllister et al. |
| 4,894,293 A | 1/1990 | Breit et al. |
| 4,920,917 A | 5/1990 | Nakatani et al. |
| 4,976,899 A | 12/1990 | Rousseau et al. |
| 5,093,155 A | 3/1992 | Miyazaki et al. |
| 5,130,194 A | 7/1992 | Baker et al. |
| 5,156,225 A | 10/1992 | Murrin |
| 5,173,367 A | 12/1992 | Liimatta et al. |
| 5,221,605 A | 6/1993 | Bard et al. |
| 5,223,353 A | 6/1993 | Ohsawa et al. |
| 5,225,265 A | 7/1993 | Prandy et al. |
| 5,227,238 A | 7/1993 | Hirai et al. |
| 5,238,808 A | 8/1993 | Bard et al. |
| 5,242,720 A | 9/1993 | Blake |
| 5,246,794 A | 9/1993 | Blomgren et al. |
| 5,310,687 A | 5/1994 | Bard et al. |
| 5,354,603 A | 10/1994 | Errede et al. |
| 5,370,921 A | 12/1994 | Cedarleaf |
| 5,470,408 A | 11/1995 | Nielson et al. |
| 5,514,217 A | 5/1996 | Niino et al. |
| 5,547,525 A | 8/1996 | Bennett et al. |
| 5,571,749 A | 11/1996 | Matsuda et al. |
| 5,639,984 A | 6/1997 | Nielson |
| 5,714,089 A | 2/1998 | Bard et al. |
| 5,731,147 A | 3/1998 | Bard et al. |
| 5,744,075 A | 4/1998 | Klett et al. |
| 5,908,585 A | 6/1999 | Shibuta |
| 5,968,274 A | 10/1999 | Fujioka et al. |
| 5,997,832 A | 12/1999 | Lieber et al. |
| 6,140,138 A | 10/2000 | Bard et al. |
| 6,146,783 A | 11/2000 | Brohm et al. |
| 6,184,280 B1 | 2/2001 | Shibuta |
| 6,205,943 B1 | 3/2001 | Lonno et al. |
| 6,221,154 B1 | 4/2001 | Lee et al. |
| 6,232,706 B1 | 5/2001 | Dai et al. |
| 6,251,520 B1 | 6/2001 | Blizzard et al. |
| 6,265,466 B1 | 7/2001 | Glatkowski et al. |
| 6,331,209 B1 | 12/2001 | Jang et al. |
| 6,333,016 B1 | 12/2001 | Resasco et al. |
| 6,361,861 B2 | 3/2002 | Gao |
| 6,382,120 B1 | 5/2002 | Keire |
| 6,413,487 B1 | 7/2002 | Resasco et al. |
| 6,420,293 B1 | 7/2002 | Chang et al. |
| 6,455,021 B1 | 9/2002 | Saito |
| 6,465,057 B1 | 10/2002 | Nakahigashi et al. |
| 6,479,028 B1 | 11/2002 | Kaner et al. |
| 6,479,030 B1 | 11/2002 | Firsich |
| 6,491,789 B2 | 12/2002 | Niu |
| 6,495,258 B1 | 12/2002 | Chen et al. |
| 6,528,572 B1 | 3/2003 | Patel et al. |
| 6,564,744 B2 | 5/2003 | Nakahigashi et al. |
| 6,641,793 B2 | 11/2003 | Haddon et al. |
| 6,653,619 B2 | 11/2003 | Chin et al. |
| 6,673,392 B2 | 1/2004 | Lee et al. |
| 6,692,717 B1 | 2/2004 | Smalley et al. |
| 6,699,525 B2 | 3/2004 | Jayatissa |
| 6,762,237 B2 | 7/2004 | Glatkowski et al. |
| 6,765,949 B2 | 7/2004 | Chang |
| 6,790,425 B1 | 9/2004 | Smalley et al. |
| 6,818,821 B2 | 11/2004 | Fujieda et al. |
| 6,837,928 B1 | 1/2005 | Zhang et al. |
| 6,852,410 B2 | 2/2005 | Veedu et al. |
| 6,863,942 B2 | 3/2005 | Ren et al. |
| 6,887,451 B2 | 5/2005 | Dodelet et al. |
| 6,900,264 B2 | 5/2005 | Kumar et al. |
| 6,900,580 B2 | 5/2005 | Dai et al. |
| 6,908,572 B1 | 6/2005 | Derbyshire et al. |
| 6,913,075 B1 | 7/2005 | Knowles et al. |
| 6,921,575 B2 | 7/2005 | Horiuchi et al. |
| 6,934,600 B2 | 8/2005 | Jang et al. |
| 6,936,653 B2 | 8/2005 | McElrath et al. |
| 6,955,800 B2 | 10/2005 | Resasco et al. |
| 6,962,892 B2 | 11/2005 | Resasco et al. |
| 6,967,013 B2 | 11/2005 | Someya et al. |
| 6,979,709 B2 | 12/2005 | Smalley et al. |
| 6,986,853 B2 | 1/2006 | Glatkowski et al. |
| 6,986,877 B2 | 1/2006 | Takikawa et al. |
| 6,994,907 B2 | 2/2006 | Resasco et al. |
| 7,011,760 B2 | 3/2006 | Wang et al. |
| 7,018,600 B2 | 3/2006 | Yanagisawa et al. |
| 7,022,776 B2 | 4/2006 | Bastiaens et al. |
| 7,045,108 B2 | 5/2006 | Jiang et al. |
| 7,056,452 B2 | 6/2006 | Niu et al. |
| 7,074,294 B2 | 7/2006 | Dubrow |
| 7,094,386 B2 | 8/2006 | Resasco et al. |
| 7,105,596 B2 | 9/2006 | Smalley et al. |
| 7,108,841 B2 | 9/2006 | Smalley et al. |
| 7,118,693 B2 | 10/2006 | Glatkowski et al. |
| 7,125,502 B2 | 10/2006 | Smalley et al. |
| 7,125,534 B1 | 10/2006 | Smalley et al. |
| 7,132,621 B2 | 11/2006 | Kumar et al. |
| 7,144,563 B2 | 12/2006 | Rao et al. |
| 7,148,619 B2 | 12/2006 | Ken et al. |
| 7,151,129 B2 | 12/2006 | Ishikawa et al. |
| 7,153,452 B2 | 12/2006 | Ogale et al. |
| 7,157,068 B2 | 1/2007 | Li et al. |
| 7,160,532 B2 | 1/2007 | Liu et al. |
| 7,211,320 B1 | 5/2007 | Cooper et al. |
| 7,226,643 B2 | 6/2007 | Juang et al. |
| 7,235,159 B2 | 6/2007 | Gu et al. |
| 7,253,442 B2 | 8/2007 | Huang et al. |
| 7,261,779 B2 | 8/2007 | Gardner |
| 7,265,174 B2 | 9/2007 | Carroll et al. |
| 7,265,175 B2 | 9/2007 | Winey et al. |
| 7,278,324 B2 | 10/2007 | Smits et al. |
| 7,285,591 B2 | 10/2007 | Winey et al. |
| 7,294,302 B2 | 11/2007 | Kolde et al. |
| 7,329,698 B2 | 2/2008 | Noguchi et al. |
| 7,338,684 B1 | 3/2008 | Curliss et al. |
| 7,354,881 B2 | 4/2008 | Resasco et al. |
| 7,354,988 B2 | 4/2008 | Charati et al. |
| 7,372,880 B2 | 5/2008 | Jablonski et al. |
| 7,378,075 B2 | 5/2008 | Someya et al. |
| 7,384,663 B2 | 6/2008 | Olry et al. |
| 7,399,794 B2 | 7/2008 | Harmon et al. |
| 7,407,640 B2 | 8/2008 | Barrera et al. |
| 7,407,901 B2 | 8/2008 | Bystricky et al. |
| 7,410,628 B2 | 8/2008 | Bening et al. |
| 7,411,019 B1 | 8/2008 | Bley |
| 7,419,601 B2 | 9/2008 | Cooper et al. |
| 7,431,965 B2 | 10/2008 | Grigorian et al. |
| 7,442,284 B2 | 10/2008 | Ren et al. |
| 7,445,817 B2 | 11/2008 | Kumar et al. |

(56) References Cited

U.S. PATENT DOCUMENTS

| | | |
|---|---|---|
| 7,448,441 B2 | 11/2008 | Hendricks et al. |
| 7,448,931 B2 | 11/2008 | Liu et al. |
| 7,459,627 B2 | 12/2008 | Lee et al. |
| 7,465,605 B2 | 12/2008 | Raravikar et al. |
| 7,473,466 B1 | 1/2009 | Muradov |
| 7,479,052 B2 | 1/2009 | Kim et al. |
| 7,488,455 B2 | 2/2009 | Dai et al. |
| 7,504,078 B1 | 3/2009 | Jacques et al. |
| 7,510,695 B2 | 3/2009 | Smalley et al. |
| 7,534,486 B2 | 5/2009 | Boerstoel et al. |
| 7,544,415 B2 | 6/2009 | Chen et al. |
| 7,563,411 B2 | 7/2009 | Jiang et al. |
| 7,563,428 B2 | 7/2009 | Resasco et al. |
| 7,569,425 B2 | 8/2009 | Huang et al. |
| 7,588,700 B2 | 9/2009 | Kwon et al. |
| 7,592,248 B2 | 9/2009 | Ventzek et al. |
| 7,597,869 B2 | 10/2009 | Hsiao |
| 7,608,798 B2 | 10/2009 | Kumar et al. |
| 7,611,579 B2 | 11/2009 | Lashmore et al. |
| 7,615,204 B2 | 11/2009 | Ajayan et al. |
| 7,615,205 B2 | 11/2009 | Jiang et al. |
| 7,632,550 B2 | 12/2009 | Mizuno et al. |
| 7,632,569 B2 | 12/2009 | Smalley et al. |
| 7,700,943 B2 | 4/2010 | Raravikar et al. |
| 7,709,087 B2 | 5/2010 | Majidi et al. |
| 7,718,220 B2 | 5/2010 | D'Silva et al. |
| 7,729,100 B2 | 6/2010 | Llorente Gonzalez et al. |
| 7,771,289 B2 | 8/2010 | Palumbo et al. |
| 7,771,798 B1 | 8/2010 | Grosse et al. |
| 7,776,777 B2 | 8/2010 | Kim et al. |
| 7,811,632 B2 | 10/2010 | Eres |
| 7,815,820 B2 | 10/2010 | Tan et al. |
| 7,816,709 B2 | 10/2010 | Balzano et al. |
| 7,862,795 B2 | 1/2011 | Zhang et al. |
| 7,867,468 B1 | 1/2011 | Haddon et al. |
| 7,867,616 B2 | 1/2011 | Harutyunyan |
| 7,871,591 B2 | 1/2011 | Harutyunyan et al. |
| 7,880,376 B2 | 2/2011 | Takai et al. |
| 7,927,701 B2 | 4/2011 | Curliss et al. |
| 8,048,490 B2 | 11/2011 | Watanabe et al. |
| 2001/0017219 A1 | 8/2001 | Kikuchi et al. |
| 2002/0022179 A1* | 2/2002 | Yuasa et al. ............... 429/163 |
| 2002/0028112 A1 | 3/2002 | Paulshus et al. |
| 2002/0035170 A1 | 3/2002 | Glatkowski et al. |
| 2002/0085968 A1 | 7/2002 | Smalley et al. |
| 2002/0090331 A1 | 7/2002 | Smalley et al. |
| 2002/0150684 A1 | 10/2002 | Jayatissa |
| 2003/0004058 A1 | 1/2003 | Li et al. |
| 2003/0024884 A1 | 2/2003 | Petrik |
| 2003/0042147 A1 | 3/2003 | Talin et al. |
| 2003/0044678 A1 | 3/2003 | ESq. |
| 2003/0068432 A1 | 4/2003 | Dai et al. |
| 2003/0094734 A1 | 5/2003 | Deckard et al. |
| 2003/0102585 A1 | 6/2003 | Poulin et al. |
| 2003/0111333 A1 | 6/2003 | Montgomery et al. |
| 2003/0122111 A1 | 7/2003 | Glatkowski |
| 2003/0143453 A1* | 7/2003 | Ren et al. .................... 429/40 |
| 2003/0166744 A1 | 9/2003 | Van Dijk et al. |
| 2003/0211029 A1 | 11/2003 | Someya et al. |
| 2003/0213939 A1 | 11/2003 | Narayan et al. |
| 2004/0007955 A1 | 1/2004 | Yaniv et al. |
| 2004/0026234 A1 | 2/2004 | Vanden Brande et al. |
| 2004/0032698 A1* | 2/2004 | Paul et al. .................... 361/15 |
| 2004/0071870 A1 | 4/2004 | Knowles et al. |
| 2004/0082247 A1 | 4/2004 | Desai et al. |
| 2004/0105807 A1 | 6/2004 | Fan et al. |
| 2004/0171725 A1 | 9/2004 | Richardson et al. |
| 2004/0184981 A1 | 9/2004 | Liu et al. |
| 2004/0245088 A1 | 12/2004 | Gardner |
| 2004/0253167 A1 | 12/2004 | Silva et al. |
| 2005/0023727 A1 | 2/2005 | Sampson |
| 2005/0042163 A1 | 2/2005 | Allison et al. |
| 2005/0049355 A1 | 3/2005 | Tang et al. |
| 2005/0062024 A1 | 3/2005 | Bessette et al. |
| 2005/0081752 A1 | 4/2005 | Snyder et al. |
| 2005/0090024 A1 | 4/2005 | Chopra |
| 2005/0090176 A1 | 4/2005 | Dean et al. |
| 2005/0095938 A1 | 5/2005 | Rosenberger et al. |
| 2005/0100501 A1 | 5/2005 | Veedu et al. |
| 2005/0112052 A1 | 5/2005 | Gu et al. |
| 2005/0119371 A1 | 6/2005 | Drzal et al. |
| 2005/0172370 A1 | 8/2005 | Haq et al. |
| 2005/0176329 A1 | 8/2005 | Olry et al. |
| 2005/0181209 A1 | 8/2005 | Karandikar |
| 2005/0188727 A1 | 9/2005 | Greywall |
| 2005/0202315 A1 | 9/2005 | Sugeno et al. |
| 2005/0204984 A1 | 9/2005 | Finot |
| 2005/0230560 A1 | 10/2005 | Glatkowski et al. |
| 2005/0260120 A1 | 11/2005 | Smalley et al. |
| 2005/0260412 A1 | 11/2005 | Gardner |
| 2005/0263456 A1 | 12/2005 | Cooper et al. |
| 2005/0284232 A1 | 12/2005 | Rice |
| 2005/0287064 A1 | 12/2005 | Mayne et al. |
| 2006/0002841 A1 | 1/2006 | Chen et al. |
| 2006/0047052 A1 | 3/2006 | Barrera et al. |
| 2006/0052509 A1 | 3/2006 | Saitoh |
| 2006/0057361 A1 | 3/2006 | Ounaies et al. |
| 2006/0060825 A1 | 3/2006 | Glatkowski |
| 2006/0065546 A1 | 3/2006 | Curodeau |
| 2006/0078705 A1 | 4/2006 | Glatkowski et al. |
| 2006/0099135 A1 | 5/2006 | Yodh et al. |
| 2006/0110599 A1 | 5/2006 | Honma et al. |
| 2006/0118158 A1 | 6/2006 | Zhang et al. |
| 2006/0121275 A1 | 6/2006 | Poulin et al. |
| 2006/0135677 A1 | 6/2006 | Huang et al. |
| 2006/0159916 A1 | 7/2006 | Dubrow et al. |
| 2006/0166003 A1 | 7/2006 | Khabashesku et al. |
| 2006/0177602 A1 | 8/2006 | Dijon et al. |
| 2006/0198956 A1 | 9/2006 | Eres |
| 2006/0202168 A1 | 9/2006 | Barrera et al. |
| 2007/0003817 A1 | 1/2007 | Umeda et al. |
| 2007/0020167 A1 | 1/2007 | Han et al. |
| 2007/0048521 A1 | 3/2007 | Istvan |
| 2007/0054105 A1 | 3/2007 | Hsiao |
| 2007/0087198 A1 | 4/2007 | Dry |
| 2007/0092431 A1 | 4/2007 | Resasco et al. |
| 2007/0110977 A1 | 5/2007 | Al-Haik et al. |
| 2007/0128960 A1 | 6/2007 | Ghasemi Nejhad et al. |
| 2007/0135588 A1 | 6/2007 | Diakoumakos et al. |
| 2007/0153362 A1 | 7/2007 | Gruner |
| 2007/0189953 A1 | 8/2007 | Bai et al. |
| 2007/0231156 A1 | 10/2007 | Hong |
| 2007/0259128 A1 | 11/2007 | Parsapour |
| 2007/0265379 A1 | 11/2007 | Chen et al. |
| 2008/0014431 A1 | 1/2008 | Lashmore et al. |
| 2008/0020193 A1 | 1/2008 | Jang et al. |
| 2008/0025906 A1 | 1/2008 | Lin et al. |
| 2008/0039557 A1 | 2/2008 | Li et al. |
| 2008/0048364 A1 | 2/2008 | Armenlades et al. |
| 2008/0053922 A1 | 3/2008 | Honsinger, Jr. et al. |
| 2008/0063585 A1 | 3/2008 | Smalley et al. |
| 2008/0073098 A1 | 3/2008 | Llorente Gonzalez et al. |
| 2008/0075954 A1 | 3/2008 | Wardle et al. |
| 2008/0118753 A1 | 5/2008 | Poulin et al. |
| 2008/0137890 A1 | 6/2008 | Petersen et al. |
| 2008/0145528 A1 | 6/2008 | Deng et al. |
| 2008/0155888 A1 | 7/2008 | Vick et al. |
| 2008/0160286 A1 | 7/2008 | Asrar et al. |
| 2008/0170982 A1 | 7/2008 | Zhang et al. |
| 2008/0173111 A1 | 7/2008 | Thostenson et al. |
| 2008/0176058 A1 | 7/2008 | Maschmann et al. |
| 2008/0176987 A1 | 7/2008 | Trevet et al. |
| 2008/0182108 A1 | 7/2008 | Curliss et al. |
| 2008/0187648 A1 | 8/2008 | Hart et al. |
| 2008/0237922 A1 | 10/2008 | Vaidyanathan et al. |
| 2008/0247938 A1 | 10/2008 | Tsai et al. |
| 2008/0248275 A1 | 10/2008 | Jang et al. |
| 2008/0279753 A1 | 11/2008 | Harutyunyan |
| 2008/0286546 A1 | 11/2008 | Lashmore et al. |
| 2008/0286564 A1 | 11/2008 | Tsotsis |
| 2008/0311301 A1 | 12/2008 | Diss et al. |
| 2009/0004480 A1 | 1/2009 | Dufresne et al. |
| 2009/0020734 A1 | 1/2009 | Jang et al. |
| 2009/0047453 A1 | 2/2009 | Folaron et al. |

(56) References Cited

U.S. PATENT DOCUMENTS

| | | |
|---|---|---|
| 2009/0047502 A1 | 2/2009 | Folaron et al. |
| 2009/0068387 A1 | 3/2009 | Panzer et al. |
| 2009/0068461 A1 | 3/2009 | Reneker et al. |
| 2009/0072222 A1 | 3/2009 | Radisic et al. |
| 2009/0081383 A1 | 3/2009 | Alberding et al. |
| 2009/0081441 A1 | 3/2009 | Shah et al. |
| 2009/0088582 A1 | 4/2009 | Inagaki et al. |
| 2009/0092832 A1 | 4/2009 | Moireau |
| 2009/0099016 A1 | 4/2009 | Carruthers et al. |
| 2009/0099276 A1 | 4/2009 | Barrera et al. |
| 2009/0117363 A1 | 5/2009 | Wardle et al. |
| 2009/0121219 A1 | 5/2009 | Song et al. |
| 2009/0121727 A1 | 5/2009 | Lynch et al. |
| 2009/0126783 A1 | 5/2009 | Lin et al. |
| 2009/0130530 A1* | 5/2009 | Tanaka .................... 429/34 |
| 2009/0136707 A1 | 5/2009 | Ueno |
| 2009/0140098 A1 | 6/2009 | Lengsfeld et al. |
| 2009/0176100 A1 | 7/2009 | Higashi et al. |
| 2009/0176112 A1 | 7/2009 | Kruckenberg et al. |
| 2009/0186214 A1 | 7/2009 | Lafdi et al. |
| 2009/0191352 A1 | 7/2009 | Dufaux et al. |
| 2009/0192241 A1 | 7/2009 | Raravikar et al. |
| 2009/0212430 A1 | 8/2009 | Wyland |
| 2009/0214800 A1 | 8/2009 | Saito |
| 2009/0220409 A1 | 9/2009 | Curliss et al. |
| 2009/0227162 A1 | 9/2009 | Kruckenberg et al. |
| 2009/0258164 A1 | 10/2009 | Nakai et al. |
| 2009/0277897 A1 | 11/2009 | Lashmore et al. |
| 2009/0282802 A1 | 11/2009 | Cooper et al. |
| 2009/0286079 A1 | 11/2009 | Barker et al. |
| 2009/0294753 A1 | 12/2009 | Hauge et al. |
| 2009/0311166 A1 | 12/2009 | Hart et al. |
| 2010/0000770 A1 | 1/2010 | Gupta et al. |
| 2010/0059243 A1 | 3/2010 | Chang |
| 2010/0074834 A1 | 3/2010 | Kim |
| 2010/0087042 A1 | 4/2010 | Kim et al. |
| 2010/0098931 A1 | 4/2010 | Daniel et al. |
| 2010/0099319 A1 | 4/2010 | Lashmore et al. |
| 2010/0112373 A1 | 5/2010 | Coffey et al. |
| 2010/0143701 A1 | 6/2010 | Zhu et al. |
| 2010/0159240 A1 | 6/2010 | Shah et al. |
| 2010/0178825 A1 | 7/2010 | Shah et al. |
| 2010/0188833 A1 | 7/2010 | Liang et al. |
| 2010/0192851 A1 | 8/2010 | Shah et al. |
| 2010/0196697 A1 | 8/2010 | D'Silva et al. |
| 2010/0197848 A1 | 8/2010 | Verghese et al. |
| 2010/0203328 A1 | 8/2010 | Hochstetter et al. |
| 2010/0206504 A1 | 8/2010 | Akiyama et al. |
| 2010/0210159 A1 | 8/2010 | Zhu |
| 2010/0221424 A1 | 9/2010 | Malecki et al. |
| 2010/0224129 A1 | 9/2010 | Malecki et al. |
| 2010/0227134 A1 | 9/2010 | Shah et al. |
| 2010/0247990 A1* | 9/2010 | Ugaji et al. .................... 429/94 |
| 2010/0254885 A1 | 10/2010 | Menchhofer et al. |
| 2010/0258111 A1 | 10/2010 | Shah et al. |
| 2010/0270069 A1 | 10/2010 | Shar et al. |
| 2010/0272891 A1 | 10/2010 | Malecki et al. |
| 2010/0276072 A1 | 11/2010 | Shah et al. |
| 2010/0279569 A1 | 11/2010 | Shah et al. |
| 2010/0311866 A1 | 12/2010 | Huang et al. |
| 2011/0017867 A1 | 1/2011 | Simmons et al. |
| 2011/0024409 A1 | 2/2011 | Shah et al. |
| 2011/0024694 A1 | 2/2011 | Shah et al. |
| 2011/0040007 A1 | 2/2011 | Chandrasekhar et al. |
| 2011/0068514 A1 | 3/2011 | Ruiz et al. |
| 2011/0089958 A1 | 4/2011 | Malecki et al. |
| 2011/0123735 A1 | 5/2011 | Shah et al. |
| 2011/0124253 A1 | 5/2011 | Shah et al. |
| 2011/0124483 A1 | 5/2011 | Shah et al. |
| 2011/0143087 A1 | 6/2011 | Alberding et al. |
| 2011/0171469 A1 | 7/2011 | Shah et al. |
| 2011/0174519 A1 | 7/2011 | Shah et al. |
| 2011/0186775 A1 | 8/2011 | Shah et al. |
| 2011/0216476 A1 | 9/2011 | Fleischer et al. |
| 2011/0242731 A1 | 10/2011 | Fleischer et al. |
| 2011/0297892 A1 | 12/2011 | Shah et al. |
| 2011/0304964 A1 | 12/2011 | Fleischer et al. |
| 2012/0000691 A1 | 1/2012 | Shah et al. |
| 2012/0052363 A1 | 3/2012 | Fleischer |

FOREIGN PATENT DOCUMENTS

| | | |
|---|---|---|
| CN | 1641905 A | 7/2005 |
| CN | 1694981 A | 11/2005 |
| CN | 1730555 A | 2/2006 |
| CN | 1796334 A | 7/2006 |
| CN | 1290764 C | 12/2006 |
| CN | 101698975 | 4/2008 |
| CN | 101173386 A | 5/2008 |
| CN | 101230145 A | 7/2008 |
| CN | 101284423 A | 10/2008 |
| CN | 101316806 A | 12/2008 |
| CN | 101365740 A | 2/2009 |
| CN | 101418886 A | 4/2009 |
| CN | 101437663 A | 5/2009 |
| CN | 201241910 Y | 5/2009 |
| CN | 101484628 A | 7/2009 |
| CN | 101565893 A | 10/2009 |
| CN | 101582302 A | 11/2009 |
| EP | 1450422 | 8/2004 |
| GB | 2294666 A | 5/1996 |
| IN | 01900DE2008 A | 3/2010 |
| JP | 49-018891 | 5/1974 |
| JP | 62-007668 | 1/1987 |
| JP | 63-242537 | 10/1988 |
| JP | 04-149068 | 5/1992 |
| JP | 04-300247 | 10/1992 |
| JP | 05-306167 | 11/1993 |
| JP | 07-165927 | 6/1995 |
| JP | 09-039125 | 2/1997 |
| JP | 10-265870 | 10/1998 |
| JP | 11-343177 | 12/1999 |
| JP | 2001-048509 A | 2/2001 |
| JP | 2002-140979 A | 5/2002 |
| JP | 2003-517541 A | 5/2003 |
| JP | 2004-002182 A | 1/2004 |
| JP | 2004-143019 A | 5/2004 |
| JP | 2005-517788 A | 6/2005 |
| JP | 2005-219950 A | 8/2005 |
| JP | 2005-538026 A | 12/2005 |
| JP | 2006-057129 A | 3/2006 |
| JP | 2006-527786 A | 12/2006 |
| JP | 2007-502246 A | 2/2007 |
| JP | 2007-119318 A | 5/2007 |
| JP | 2007-523033 A | 8/2007 |
| JP | 2007-314421 A | 12/2007 |
| JP | 2008-068330 A | 3/2008 |
| JP | 2009-013327 A | 1/2009 |
| JP | 2009-057249 A | 3/2009 |
| JP | 2009-517531 A | 4/2009 |
| JP | 2009-535530 A | 10/2009 |
| JP | 2009-537339 A | 10/2009 |
| JP | 2011-512315 A | 4/2011 |
| KR | 100829001 | 5/2008 |
| TW | 200833861 | 8/2008 |
| WO | WO-03/078832 | 9/2003 |
| WO | WO 03/082733 | 10/2003 |
| WO | WO 2005/005554 | 1/2005 |
| WO | WO-2005/05554 A2 | 1/2005 |
| WO | WO 2005/075341 | 8/2005 |
| WO | WO 2006/004853 | 5/2006 |
| WO | WO 2006/048531 | 5/2006 |
| WO | WO-2006/082829 A1 | 8/2006 |
| WO | WO 2006/115486 | 11/2006 |
| WO | WO 2007/015710 | 2/2007 |
| WO | WO 2007/061854 | 5/2007 |
| WO | WO 2007/063764 | 6/2007 |
| WO | WO 2007/089118 | 8/2007 |
| WO | WO-2007/130979 A2 | 11/2007 |
| WO | WO-2007/136755 | 11/2007 |
| WO | WO 2007/149109 | 12/2007 |
| WO | WO 2008/012196 | 1/2008 |
| WO | WO 2008/041183 | 4/2008 |
| WO | WO 2008/054541 | 5/2008 |

(56) References Cited

FOREIGN PATENT DOCUMENTS

| WO | WO-2008/068042 A2 | 6/2008 |
|----|----|----|
| WO | WO-2008/654446 | 6/2008 |
| WO | WO 2008/085634 | 7/2008 |
| WO | WO-2008085550 A2 | 7/2008 |
| WO | WO 2008/115640 | 9/2008 |
| WO | WO-2008/115913 A2 | 9/2008 |
| WO | WO-2008/133299 A1 | 11/2008 |
| WO | WO 2009/004346 | 1/2009 |
| WO | WO 2009/007617 A2 | 1/2009 |
| WO | WO-2009/080048 A2 | 7/2009 |
| WO | WO 2009/103925 | 8/2009 |
| WO | WO-2009/108226 A2 | 9/2009 |
| WO | WO 2009/110885 | 9/2009 |
| WO | WO 2009/124862 | 10/2009 |
| WO | WO-2010/006807 A2 | 1/2010 |
| WO | WO-2011/053457 | 5/2011 |

OTHER PUBLICATIONS

Qu, et al., "Carbon Microfibers Sheathed with Aligned Carbon Nanotubes: Towards Multidimensional, Multicomponent, and Multifunctional Nanomaterials, " Small, Aug. 2006, pp. 1052-1059, vol. 2, No. 8-9.

Yamamoto, et al., "High-yield growth and morphology control of aligned carbon nanotubes on ceramic fibers for multifunctional enhancement of structural composites," Carbon, Mar. 2009, pp. 551-560, vol. 47, No. 3.

Veedu, et al., "Multifunctional composites using reinforced laminae with carbon-nanotube forests," Nature Materials, Jun. 2006, pp. 457-462, vol. 5.

Database WPI, Week 200902, Thompson Scientific London, GB, AN 2009-A40289 & KR 100 829 001 B1 (Korea Inst Energy Res) May 14, 2008, abstract.

Meyyappan, Carbon Nanotubes: Science and Applications, Jul. 31, 2007.

U.S. Appl. No. 61/295,621, Jan. 15, 2010, Harry C. Malecki.

U.S. Appl. No. 61/297,704, filed Jan. 22, 2010, Tushar K. Shah.

Ago, et al., "Colloidal Solution of Metal Nanoparticles as a Catalyst for Carbon Nanotube Growth", Proceedings Materials Research Society, Fall 2000, pp. A13.18.1-A13.18.5, vol. 633, Materials Research Society.

Bradford, et al., "Electrical Conductivity Study of Carbon nanotube Yarns, 3-D Hybrid Braids and their Composites", Jouranl of Composite Materials, pp. 1533-1545, vol. 42, No. 15, SAGE Productions, Los Angeles, London, New Delhi and Singapore.

Bubert, et al., "Basic analytical investigation of plasma-chemically modified carbon fibers", Spectrochimica Acta Part B., 2002, pp. 1601-1610, vol. 57, Elsevier Science B.V.

Chae, et al., "A comparison of reinforcement efficiency of various types of carbon nanotubes in polyacrylonitrile fiber", Polymer, Nov. 21, 2005, pp. 10925-10935, vol. 46, No. 24, Elsevier Ltd.

Che, et al., "Chemical Vapor Deposition Based Synthesis of Carbon Nanotubes and Nanofibers Using a Template Method", Chem. Mater., 1998, pp. 260-267, vol. 10, American Chemical Society.

Chen, et al., "Basalt fiber-epoxy laminates with functionalized multi-walled carbon nanotubes", Composites, Part A, 2009, pp. 1082-1089, vol. 40, Elsevier Ltd.

Chen, et al., "Pulsed electrodeposition of Pt nanoclusters on carbon nanotubes modified carbon materials using diffusion restricting viscous electroyles", Electrochemistry Communications, Jun. 2007, pp. 1348-1354, vol. 9, Elsevier B.V.

Ci, et al., "Direct Growth of Carbon Nanotubes on the Surface of Ceramic Fibers", Carbon, 2005, pp. 883-886, vol. 43, No. 4, Elsevier Ltd.

Franz, et al., "Carbon Single-Wall Nanotube Growth in a Volumetrically Confined Arc Discharge System", U.S. Departement of Energy Journal of Undergraduate Research, pp. 66-69, publication date unknown.

Garcia, et al., "Aligned Carbon Nanotube Reinforcement of Advanced Composite Ply Interfaces," 49th AIAA/ASCE/AHS/ASC Structures, Structural Dynamics, and Materials Conference, Apr. 7-10, 2008, Schaumburg, IL, MIT, American Institute of Aeronautics and Astronautics, Inc.

Hsu, et al., "Optical Absorption and Thermal Transport of Individual Suspended Carbon Nanotube Bundles", Nano Lett., 2009, pp. 590-594, vol. 9, No. 2, American Chemical Society, Publication Date (Web): Jan. 13, 2009.

Jiang, et al., "Carbon nanotube-coated solid-phase microextraction metal fiber based on sol-gel technique", Journal of Chromatography A., May 29, 2009, pp. 4641-4647, vol. 1216, Elsevier B.V.

Jiang, et al., "Plasma-Enhanced Deposition of Silver Nanoparticles onto Polymer and Metal Surfaces for the Generation of Antimicrobial Characteristics", Journal of Applied_Polymer Science, 2004, pp. 1411-1422, vol. 93, Wiley Periodicals, Inc.

Jung, et al., "Fabrication of radar absorbing structure (RAS) using GFR-nano composite and spring-back compensation of hybrid composite RAS shells", Composite Structures, 2006, pp. 571-576, vol. 75, Elsevier Ltd.

Kim, et al., "Processing, characterization, and modeling of carbon nanotube-reinforced multiscale composites," Composites Science and Technology, 2009, pp. 335,342, vol. 69, Elsevier Ltd.

Kind, et al., "Patterned Films of Nanotubes Using Microcontact Printing of Catalysts", Adv. Mater., 1999, pp. 1285-1289, vol. 11, No. 15, WILEY-VCH Verlag GmbH, D-69469 Weinheim.

Kramer, et al., Constrained Iron Catalysts for Single-Walled Carbon Nanotube Growth?, Langmuir 2005, 21, 8466-8470 [http://pubs.acs.org/doi/abs/10.1021/la0506729].

Laachachi, et al., "A chemical method to graft carbon nanotubes onto a carbon fiber", Materials Letters, 2008, pp. 394-397, vol. 62, Elsevier B.V.

Lee, "Syntheses and properties of fluorinated carbon materials", Journal of Fluorine Chemistry, 2007, pp. 392-403, vol. 128, Elsevier B.V.

Lee, et al., "Fabrication and design of multi-layered radar absorbing structures of MWNT-filled glass/epoxy plain-weave composites", Composite Structures, 2006, pp. 397-405, vol. 76, Elsevier Ltd.

Li, et al., "A Miniature glucose/$O_2$ biofuel cell with single-walled carbon nanotubes-modified carbon fiber microelectrodes as the substrate", Electrochemistry Communications, Jun. 2008, pp. 851-854, vol. 10, Elsevier B.V.

Li, et al., "Electromagnetic Interference (EMI) Shielding of Single-Walled Carbon Nanotube Epoxy Composites", Nano Lett., 2006, pp. 1141-1145, vol. 6, No. 6, American Chemical Society.

Lux, "PCT Application No. PCT/US2007/086875 Search Report and Written Opinion", May 13, 2008.

Makris, et al., "Carbon Nanotubes Growth and Anchorage to Carbon Fibres", Carbon Nanotubes, 2006, pp. 57-58, vol. 222, Springer, the Netherlands.

Meyyappan, et al., "Carbon nanotube growth by PECVD: a review", Plasma Sources Sci. Technol., 2003, pp. 205-216, vol. 12, IOP Publishing Ltd, UK.

Mylvaganam, "Fabrication and Application of Polymer Composites Comprising Carbon Nanotubes", Recent Pat Nanotechnol., 2007, pp. 59-65, vol. 1, Bentham Science Publishers, Ltd.

Panhuis, et al., "Carbon Nanotube Mediated Reduction in Optical Activity in Polyaniline Composite Materials", J. Phys. Chem. C, 2008, pp. 1441-1445, vol. 112, American Chemical Society.

Pisco, et al., "Hollow fibers integrated with single walled carbon nanotubes: Bandgap modification and chemical sensing capability", Sensors and Actuators B, 2008, pp. 163-170, vol. 129, Elsevier B.V.

Račkauskas "Carbon nanotube growth and use in energy sector", Energetika, 2006, pp. 43-46, vol. 2.

Satishkumar, et al., "Bundles of aligned carbon nanotubes obtained by the pyrolysis of ferrocene-hydrocarbon mixtures: role of the metal nanoparticles produced in situ", Chemical Physics Letters, 1999, pp. 158-162, vol. 307, Elsevier Science B.V.

Suh, et al., "Highly ordered two-dimensional carbon nanotube arrays", Applied Physics Letters, Oct. 4, 2002, pp. 2047-2049, vol. 75, No. 14, American Institute of Physics.

(56) References Cited

OTHER PUBLICATIONS

Thostenson, et al., "Carbon nanotube/carbon fiber hybrid multiscale composites", J. Appl. Phys., 2002, pp. 6034-6037, vol. 91, No. 9, American Institute of Physics.

Vaccarini et al., "Reinforcement of an Epoxy Resin by Single Walled Nanotubes", AIP Conference Proceedings, Nov. 21, 2000, vol. 544, pp. 521-525.

Wang et al., "Processing and Property Investigation of Single-Walled Carbon Nanotube ISWNT) Buckypapaper/Epoxy Resin Matrix Nanocomposit, Composites Part A: Applied Science and Manufacturing", Oct. 1, 2004, pp. 1225-1232. Publisher: PCT/ Published in : PCT.

Wang, et al., "Penetration depth of atmospheric pressure plasma surface modification into multiple layers of polyester fabrics", Surface and Coatings Technology, 2007, pp. 77-83, vol. 202, Elsevier B.V.

Wichmann, et al., "Glass-fibre-reinforced composites with enhanced mechanical and electrical properties—Benefits and limitations of a nanoparticle modified matrix", Engineering Fracture Mechanics, 2006, pp. 2346-2359, vol. 73, Elisevier Ltd.

Xu, et al., "Bone-Shaped Nanomaterials for Nanocomposite Applications", Nano Lett., 2003, pp. 1135-1139, vol. 3, No. 8, American Chemical Society.

Yabe, et al., Synthesis of well-aligned carbon nanotubes by radio frequency plasma enhanced CVD method , Diamond and Related Materials, 2004, pp. 1292-1295, vol. 13, Elsevier B.V.

Yanagishita, et al., "Carbon Nanotubes with a Triangular Cross-section, Fabricated Using Anodic Porous Alumina as the Temple", Adv. Mater., 204, pp. 429-432, vol. 16, No. 5, WILEY-VCH Verlag GmbH & Co. KGaA, Weinheim.

Yang, et al., "Electrical Conductivity and Electromagnetic Interference Shielding of Multi-walled Carbon Nanotube Filled Polymer Composites" Mater. Res. Soc. Symp. Proc., 2005, pp. HH5.3.1-HH.5.3.5, vol. 858E, Materials Research Society.

Yeh, et al., "Mechanical properties of phenolic-based nanocomposites reinforced by multi-walled carbon nanotubes and carbon fibers", Composites: Part A, 2008, pp. 677-684, vol. 39, No. 4.

Zhang et al., "Integration and characterization of aligned carbon nanotubes on metal/silicon substrates and effects of water", Applied Surface Science 255 (2009) 5003-5008, entire document.

Zhang, et al., "In situ growth of carbon nanotubes on inorganic fibers with different surface properties," Materials Chemistry and Physics, 2008, pp. 317-321, vol. 107, Science Direct.

Zhao, et al., "Growth of carbon nanotubes on the surface of carbon fibers", Carbon, 2007, pp. 380-383, vol. 46, No. 2, Elsevier Ltd.

Zhao, et al., "The growth of multi-walled carbon nanotubes with different morphologies on carbon fibers", Carbon, 2005, pp. 651-673, vol. 43, Elsevier Ltd.

Zhu, et al., "Carbon nanotube growth on carbon fibers", Diamond and Related Materials, 2003, pp. 1825-1825, vol. 12, Elsevier B.V.

Zhu, et al., "Synthesis of single-walled carbon nanotubes by the vertical floating catalyst method," Chinese Science Bulletin, 2002, pp. 159-162, vol. 47, No. 2.

Thostenson, et al., "Carbon Nanotube Networks: Sensing of Distributed Strain and Damage for Life Prediction and Self Healing," Advanced Materials, Nov. 2006, pp. 2837-2841, vol. 18, No. 21.

Gou, et al., "Carbon nanofiber paper for lightning strike protection of composite materials," Composites Part B, Jul. 2009, p. 192-198, vol. 41, No. 2.

Fiedler, et al., "Can Carbon Nanotubes be Used to Sense Damage in Composites?," Ann Chim Sci Mat, Jan. 2004, pp. 81-94, vol. 29, No. 6.

Garcia, et al., "Fabrication and multifunctional properties of a hybrid laminate with aligned carbon nanotubes grown in situ," Composites Science and Technology, Jul. 2008, vol. 68, No. 9.

Database WPI, Week 200902, Thomson Scientific, London, May 14, 2008 Abstract XP-002728955.

* cited by examiner

STRUCTURAL ENERGY STORAGE ASSEMBLIES AND METHODS FOR PRODUCTION THEREOF

CROSS-REFERENCE TO RELATED APPLICATIONS

This application claims the benefit of priority under 35 U.S.C. §119 from U.S. Provisional Patent Application Ser. No. 61/378,378, filed Aug. 30, 2010, which is incorporated herein by reference in its entirety.

STATEMENT REGARDING FEDERALLY SPONSORED RESEARCH OR DEVELOPMENT

Not applicable.

FIELD OF THE INVENTION

The present invention generally relates to energy storage, and, more specifically, energy storage within a structural energy storage assembly.

BACKGROUND

Multi-functional composite materials have been the subject of considerable research interest as a result of steadily increasing demand for consumer, industrial and military products having improved performance and functionality. Specifically, composite materials having at least one specialized function, in addition to providing simple structural support and/or mechanical strength, have been particularly sought out by the engineering community in order to address the foregoing demand for high performance products. One particularly desirable multi-functional composite material that has been the subject of intense research is an assembly that provides both an energy storage medium and significant structural support. Although various approaches have been applied toward development of such multi-functional composite materials having energy storage capabilities, research efforts to date have failed to realize an adequate combination of strength, charge storage capacity and/or charge storage density, and manufacturing ease.

Certain high performance materials, including carbon nanotubes, have been proposed for use in multi-functional composite materials due to their high mechanical strength, large effective surface area, and electrical conductivity. Although carbon nanotubes offer significant potential for developing multi-functional composite materials, research efforts to date have failed to deliver on the promise offered by these entities. In a like manner, carbon nanotubes can offer the potential to significantly enhance the properties of electrical storage devices such as, for example, batteries and supercapacitors. In this regard, carbon nanotubes can be used to replace carbon black and/or electrode materials of conventional electrical storage devices in order to lessen their weight and/or to improve their charge storage properties.

In view of the foregoing, multi-functional composite materials that provide both good structural support and energy storage capabilities would be of significant benefit in the art. The present invention satisfies this need and provides related advantages as well.

SUMMARY

In some embodiments, energy storage assemblies are described herein. The energy storage assemblies contain at least one energy storage layer that contains an insulating layer having a plurality of openings arranged in a spaced apart manner, and a plurality of energy storage devices, where each energy storage device is contained within one of the openings. The plurality of energy storage devices are electrically connected to one another.

In some embodiments, the energy storage assemblies described herein contain at least two stress carrying layers and at least one energy storage layer disposed between the at least two stress carrying layers. The at least one energy storage layer contains a support material, an insulating layer having a plurality of openings arranged in a spaced apart manner, and a plurality of energy storage devices, where each energy storage device is contained within one of the openings.

In some embodiments, methods described herein include disposing a plurality of energy storage devices on a support material in a spaced apart manner, and disposing an insulator layer around the plurality of energy storage devices on the support material, thereby forming an energy storage layer.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

The present disclosure is directed, in part, to structural energy storage assemblies such as, for example, multi-functional composite materials. The present disclosure is also directed, in part, to methods for making structural energy storage assemblies. Traditional energy storage devices such as, for example, batteries and capacitors can be used in the energy storage assemblies described herein. Optionally, the energy storage assemblies can make use of energy storage devices that have been enhanced with carbon nanotubes.

Embodiments described herein take advantage of simple beam theory, a brief discussion of which follows. It is to be recognized that the following discussion of simple beam theory should not be considered mechanistically limiting. As used herein, the term "beam" refers to a substantially rigid structural member that is supported on at least its ends and is subject to a transverse shear force that results in tension/compression stress in the beam that is perpendicular to the applied shear force. Although the term "beam" can refer to structural members having a large aspect ratio, it is to be recognized that the term "beam" should be more broadly construed herein to represent any rigid structural member that bears a transverse shear force.

Figure 1:
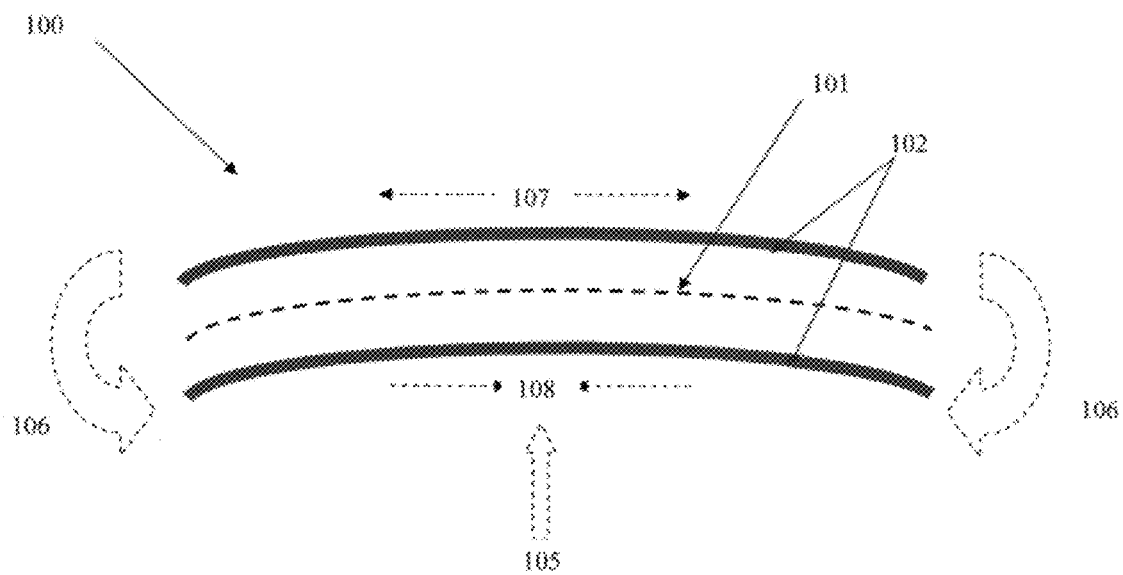
FIG. 1 shows an illustrative schematic of a beam under a load.

FIG. 1 shows an illustrative schematic of a beam 100 under a load. According to simple beam theory, the interior of beam 100 near neutral axis 101 is under shear stress from load 105, but not under appreciable tension/compression stress 107 and 108, which arises from bending forces 106. In contrast, exterior faces 102 of beam 100 experience considerable tension/compression stress 107 and 108 when placed under a load.

In view of the foregoing, it has been advantageously recognized according to the present invention that at least a portion of the interior of a beam can be replaced with a material that is primarily functional rather than primarily structural. Since the interior of a beam is subject to minimal tension/compression stress, the replacement material needs only to be capable of bearing a shear load in order to maintain structural integrity comparable to that of an unmodified beam. According to the present embodiments, an energy storage assembly can replace at least a portion of the interior of a beam in order to produce a multi-functional composite material that is capable of storing electrical charge while maintaining significant resistance to tension/compression stress. In addition, by replacing at least a portion of the interior of a beam with a replacement material, the overall weight of the beam can be maintained or reduced relative to that of an unmodified beam, according to some embodiments, while maintaining comparable structural integrity and gaining advantageous functional properties. Although not preferred, if the replacement material is heavier than the beam material, the overall weight of the beam will be increased.

Replacement of the interior of a beam can be particularly advantageous and facile for layered composite materials (e.g., sandwich-type structures), containing an energy storage assembly located between at two stress carrying layers. As used herein, the term "stress carrying layers" will refer to a material that is capable of bearing significant tension/compression stress, particularly when used as the exterior layer(s) of a layered composite material.

A particular advantage of composite materials containing the present energy storage assemblies is that an article formed therefrom can exhibit enhanced performance relative to an article lacking an energy storage assembly, while not significantly altering the weight or mechanical properties of the original article. That is, articles can be constructed using the present energy storage assemblies that have a comparable or reduced weight and like mechanical properties relative to a like article lacking an energy storage assembly. Accordingly, articles produced in accordance with the present embodiments can make use of the functional energy storage capacity therein so as to have longer operating times relative to comparable articles lacking an energy storage assembly. Other operational advantages in articles containing an energy storage assembly can be realized as well.

A further advantage of the present energy storage assemblies is that they are highly compatible with traditional manufacturing techniques and materials used for preparing layered composite materials. Furthermore, the energy storage assemblies described herein are compatible with common energy storage devices such as, for example, traditional batteries (e.g., Li-ion batteries) and capacitors, a number of configurations for which are known to one having ordinary skill in the art. Although the energy storage devices used in the present embodiments can be further enhanced (e.g., by incorporation of carbon nanotubes therein), there is no specific manufacturing requirement to do so.

Still further, the energy storage assemblies described herein are not particularly limited in scale and can be used to form articles having a wide breadth of sizes. Ultimately, the size of the energy storage devices in an energy storage assembly determines its thickness. As a number of energy storage device sizes and configurations are available to one having ordinary skill in the art, a wide array of energy storage assembly sizes and configurations can be prepared. Accordingly, articles that are a less than about one millimeter thick to tens or hundreds of centimeters thick can be fabricated from the energy storage assemblies. In addition, by stacking the energy storage assemblies, even thicker articles can be prepared, if desired.

The energy storage assemblies described herein can advantageously distribute electric charge storage capacity throughout an article formed therefrom. That is, the present embodiments can allow an energy storage medium to be spread throughout an article, as opposed to a like article having a single concentrated energy storage site such as, for example, a large centralized battery or like energy storage device. By electrically connecting decentralized, smaller energy storage devices in series and/or parallel in the present embodiments, electrical storage properties comparable to those of a larger energy storage device can be realized. Although articles containing the present energy storage assemblies can also contain one or more centralized energy storage devices, the distribution of electric charge storage capacity can represent a particular advantage for certain articles.

A number of articles can potentially make use of the present energy storage assemblies. For example, unmanned aerial vehicles (UAVs), airplanes, satellites and hybrid gas-electric vehicles containing the present energy storage assemblies could exhibit extended operating times without having their operational integrity significantly impacted. In general, any article that makes use of a power supply, particularly those that are formed by composite processing techniques, can make advantageous use of the present energy storage assemblies. However, articles that do not conventionally draw or use electric charge themselves can also make use of the present energy storage assemblies. For example, structural articles such as, for example, pipelines, electrical towers, bridges and buildings can have energy storage assemblies incorporated therein. These structural articles can then be used to acquire and store electricity (e.g., through solar energy collection) until the energy is needed elsewhere. Therefore, the present energy storage assemblies can be used to supplement traditional electrical grid applications. Likewise, they can be utilized in numerous applications more traditionally associated with energy collection including, for example, solar energy collection, hydroelectric energy collection, wind farm energy collection, and the like.

As used herein, the term "opening" refers to a vacant space within an insulating layer. In some embodiments, an opening can be a hole that extends through the insulating layer. In other embodiments, an opening can be a depression or void that does not extend completely through the insulating layer.

As used herein, the term "flexible" refers to the condition of being able to be bent without breaking.

As used herein, the terms "fiber," "fiber material," or "filament" equivalently refer to any material that has a fibrous component as a basic structural feature. As used herein, the term "continuous fibers" refers to spoolable lengths of fiber materials such as individual filaments, yarns, rovings, tows, tapes, ribbons, woven and non-woven fabrics, plies, mats, and the like.

As used herein, the term "infused" refers to being bonded and "infusion" refers to the process of bonding. As used herein, the terms "carbon nanotube-infused fiber," "carbon nanotube-infused fiber material," or "fibers that are infused with carbon nanotubes" equivalently refer to a fiber material that has carbon nanotubes bonded thereto. Such bonding of carbon nanotubes to a fiber material can involve mechanical attachment, covalent bonding, ionic bonding, pi-pi interactions (pi-stacking interactions), and/or van der Waals force-mediated physisorption. In some embodiments, the carbon nanotubes can be directly bonded to the fiber material. In other embodiments, the carbon nanotubes can be indirectly bonded to the fiber material via a barrier coating and/or catalytic nanoparticles used to mediate growth of the carbon nanotubes. The particular manner in which the carbon nanotubes are infused to the fiber material can be referred to as the bonding motif.

As used herein, the terms "spoolable lengths" or "spoolable dimensions" equivalently refer to a fiber material that has at least one dimension that is not limited in length, thereby allowing the fiber material to be stored on a spool or mandrel. A fiber material of "spoolable lengths" or "spoolable dimensions" has at least one dimension that indicates the use of either batch or continuous processing for carbon nanotube infusion thereon.

As used herein, the term "nanoparticle" refers to particles having a diameter between about 0.1 nm and about 100 nm in equivalent spherical diameter, although nanoparticles need not necessarily be spherical in shape. As used herein, the term "catalytic nanoparticle" refers to a nanoparticle that possesses catalytic activity for mediating carbon nanotube growth.

As used herein, the term "transition metal" refers to any element or alloy of elements in the d-block of the periodic table (Groups 3 through 12), and the term "transition metal salt" refers to any transition metal compound such as, for example, transition metal oxides, carbides, nitrides, nitrates, sulfides, sulfates, phosphates, halides (e.g., fluorides, chlorides, bromides, and iodides), acetates, citrates and the like. Illustrative transition metals that can form catalytic nanoparticles suitable for synthesizing carbon nanotubes include, for example, Ni, Fe, Co, Mo, Cu, Pt, Au, Ag, alloys thereof, salts thereof, and mixtures thereof.

As used herein, the terms "sizing agent," or "sizing," collectively refer to materials used in the manufacture of fiber materials as a coating to protect the integrity of the fiber material, to provide enhanced interfacial interactions between the fiber material and a matrix material, and/or to alter and/or to enhance certain physical properties of the fiber material.

As used herein, the term "uniform in length" refers to a condition in which carbon nanotubes have lengths with tolerances of plus or minus about 20% or less of the total carbon nanotube length, for carbon nanotube lengths ranging from about 1 μm to about 500 μm. At very short carbon nanotube lengths (e.g., about 1 μm to about 4 μm), the tolerance can be plus or minus about 1 μm, that is, somewhat more than about 20% of the total carbon nanotube length.

As used herein, the term "uniform in density distribution" refers to a condition in which the carbon nanotube coverage density on a fiber material has a tolerance of plus or minus about 10% over the fiber material surface area that is covered with carbon nanotubes.

Embodiments described herein make use of at least one energy storage layer. Such energy storage layers contain at least 1) an insulating layer that has a plurality of openings arranged in a spaced apart manner, and 2) a plurality of energy storage devices, where each energy storage device is contained within one of the openings. Although the energy storage devices can be accessed separately, if desired, it is generally the case that the energy storage devices are electrically connected to one another.

Figure 2:
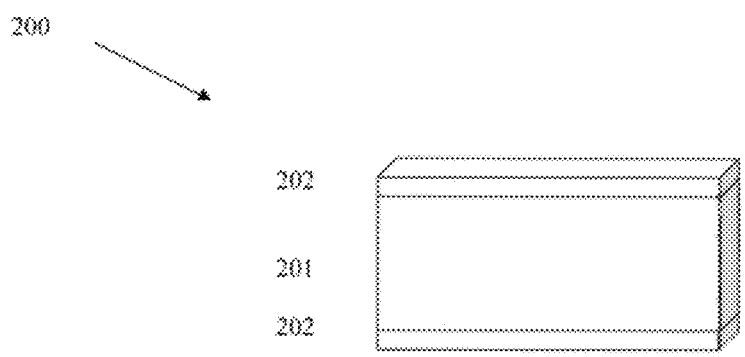
FIG. 2 shows an illustrative isometric schematic of a traditional layered composite material containing an insulating layer and two stress carrying layers.

According to the present embodiments, the insulating layer of the at least one energy storage layer can provide the shear strength needed to successfully replace the interior portions of a beam. That is, in a traditional layered composite material, the at least one energy storage layer can make up at least a portion of the interior of the composite material. FIG. 2 shows an illustrative isometric schematic of a traditional layered composite material 200 containing interior layer 201 and stress carrying layers 202. It has been surprisingly discovered that a plurality of openings can be disposed within interior layer 201 without significantly impacting the layer's shear strength, as discussed in more detail hereinbelow. In addition to maintaining the shear strength, the disposition of openings within the insulating layer can improve the flexibility of interior layer 201, which can be further advantageous in the present embodiments. According to the present embodiments, interior layer 201 can be an electrically insulating layer (e.g., a dielectric material). By placing an energy storage device in each of the openings within the insulating layer, a multi-functional composite material can be created that is both structurally sound and capable of energy storage.

Figure 3A:
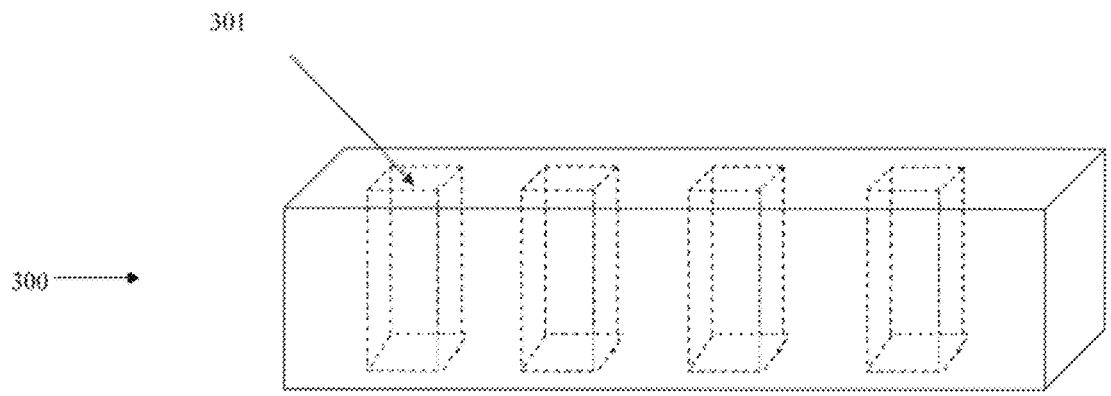
FIG. 3A shows an illustrative isometric schematic of an insulating layer in which a plurality of holes have been opened therein.
Figure 3B:
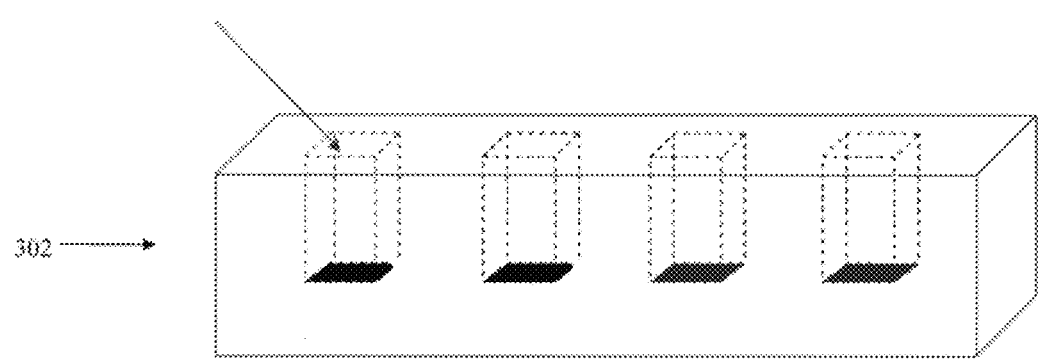
FIG. 3B shows an illustrative isometric schematic of an insulating layer in which a plurality of depressions have been opened therein.

In some embodiments, the openings within the insulating layer can be a plurality of holes. FIG. 3A shows an illustrative isometric schematic of an insulating layer 300 in which a plurality of holes 301 have been opened therein. The holes extend through the insulating layer. In other embodiments, the openings within the insulating layer can be a plurality of depressions. FIG. 3B shows an illustrative isometric schematic of an insulating layer 302 in which a plurality of depressions 303 have been opened therein. The depressions extend incompletely through the insulating layer. Since the incorporation of openings in the insulating layer can result in a negligible impact on its shear strength, energy storage devices can be incorporated within the openings in order to instill functionality into what would otherwise constitute dead weight in a composite material. Although the energy storage devices can enhance shear strength or another mechanical property of the insulating layer, if desired, there is no requirement for them to do so.

To demonstrate that openings within the interior layer of a composite material may not significantly impact its shear strength, preliminary modeling studies were conducted using an isotropic beam material made from aluminum. Modeling studies were conducted with Pro Engineer Mechanica software by Parametric Technology Corporation. As a control, a 0.07" thick beam was modeled to determine its weight and maximum stress. For such a beam, the weight was 0.0142 pounds, and the maximum stress was 1.25 ksi. Next, a 0.08" thick beam having 0.03"×0.043"×0.43" openings (depressions) every 0.5" was modeled to determine its weight and maximum stress. In this case, the weight was 0.012 pounds, and the maximum stress was only reduced to 1.11 ksi. Thus, for only a slightly larger beam, the weight was reduced by ~15% and the maximum stress was reduced by only ~10%. The 15% weight loss can be replaced with energy storage devices according to the present embodiments to produce a beam that is only marginally thicker and weaker than the original beam. It should be noted that the foregoing analysis presents only a preliminary showing demonstrating that the maximum stress of an insulating layer can be largely maintained with openings disposed therein. It is in no manner suggested that the foregoing dimensions of the openings or the placement thereof represents an optimum arrangement for maintaining stress within an insulating layer.

Ultimately, the height of the energy storage devices determines the minimum height of the insulating layer. In various embodiments, the height of the insulating layer can be at least that of the energy storage devices. In some embodiments, the height of the insulating layer can be substantially the same as that of the energy storage devices. In such embodiments, the openings in the insulating layer constitute holes, since the insulating layer does not overcoat the energy storage devices if they are substantially the same height. In other embodiments, the height of the insulating layer can be greater than that of the energy storage devices. In such embodiments, the openings in the insulating layer can be in the form of either holes or depressions. For example, if the insulating layer height exceeds the height of the energy storage devices but does not overcoat them, then the openings can be in the form of holes, with the energy storage devices not completely filling the volume of the holes. However, if the insulating layer height exceeds the height of the energy storage devices and overcoats them, then the openings can be in the form of depressions or voids. In the such embodiments, the energy storage devices can either completely fill or incompletely fill the volume of the depressions.

In some embodiments, energy storage assemblies described herein can contain at least one energy storage layer that comprises an insulating layer having a plurality of openings arranged in a spaced apart manner, and a plurality of energy storage devices, each being contained within one of the openings. In the energy storage assemblies, the plurality of energy storage devices can be electrically connected to one another. In some embodiments, the openings can be depressions that extend partially through the insulating layer. In other embodiments, the openings can be holes that extend completely through the insulating layer.

In general, the insulating layer of the present embodiments can be a polymer or a fiber-reinforced polymer composite. As noted above, the insulating layer can provide structural integrity and shear support to the energy storage layer. In some embodiments, the fiber reinforced polymer composite can be a fiberglass composite. In some embodiments, a suitable polymer for the insulating layer can be a polycarbonate. Other thermoplastic and thermosetting polymers can be envisioned by one having ordinary skill in the art.

In some embodiments, the energy storage layer can further contain a support material upon which the plurality of energy storage devices and the insulating layer are disposed. In general, such support materials can maintain some degree of flexibility such that the energy storage layer also is flexible. Such support materials can have at least sufficient structural integrity to support the plurality of energy storage devices and the insulating layer.

In general, the support material can be relatively thin in comparison to the height of the energy storage devices and the insulating layer. That is, in such embodiments, the support material is thinner than the energy storage device or the insulating layer. In some embodiments, the support material can be in the form of a structure such as, for example, a flexible wafer or membrane. In some embodiments, the support material can be in the form of a flexible ribbon material. In some embodiments, the support material can be a polymer such as, for example, a thermoplastic or thermosetting polymer (e.g., an epoxy). In some embodiments, the support material can be a printed circuit board substrate. In such embodiments, the electrical connections between the plurality of energy storage devices can be on the support material. Illustrative printed circuit board substrates can include, for example, dielectric materials that are laminated together with an epoxy resin. A number of printed circuit board substrates are known to one having ordinary skill in the art, any of which can be chosen to suit a particular implementation of the present embodiments.

When disposed on a support material, the energy storage devices can be arranged in single row in some embodiments. In alternative embodiments, multiple rows of the energy storage devices can be arrayed on the support material (e.g., a grid structure). In some embodiments, the energy storage devices within the energy storage layer can be in the form of a grid structure. In forming an energy storage assembly, multiple rows of the energy storage devices can be arrayed in a grid structure by initially forming the energy storage layer on a support material having multiple rows of energy storage devices, or by laying multiple rows of single-row energy storage layers alongside one another (see FIG. 5).

In general, any energy storage device of a suitable size can be used in the present embodiments. In some embodiments, the energy storage devices can be batteries. In some embodiments, a suitable battery can be a lithium-ion battery. In other embodiments, the energy storage devices can be capacitors or supercapacitors. In some embodiments, the energy storage devices can be further enhanced with carbon nanotubes.

Electrical connections between the energy storage devices can be established through any means known to one having ordinary skill in the art. In some embodiments, at least some of the energy storage devices are connected in parallel. In some embodiments, at least some of the energy storage devices are connected in series. In some embodiments, at least some of the energy storage devices are connected in series and in parallel. One of ordinary skill in the art will recognize that any combination of series and parallel electrical connections can be used to establish a desired voltage and current for the energy storage layer in the present energy storage assemblies.

Figure 4A:
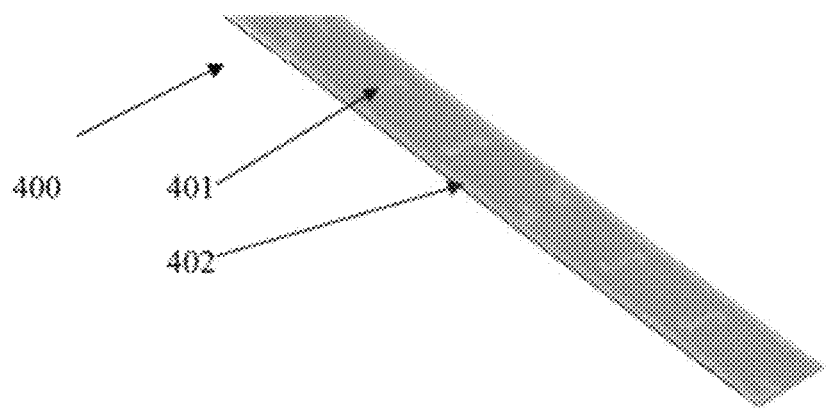
FIG. 4A shows an illustrative schematic of a printed circuit board having series electrical connections and parallel electrical connections printed thereon.
Figure 4B:
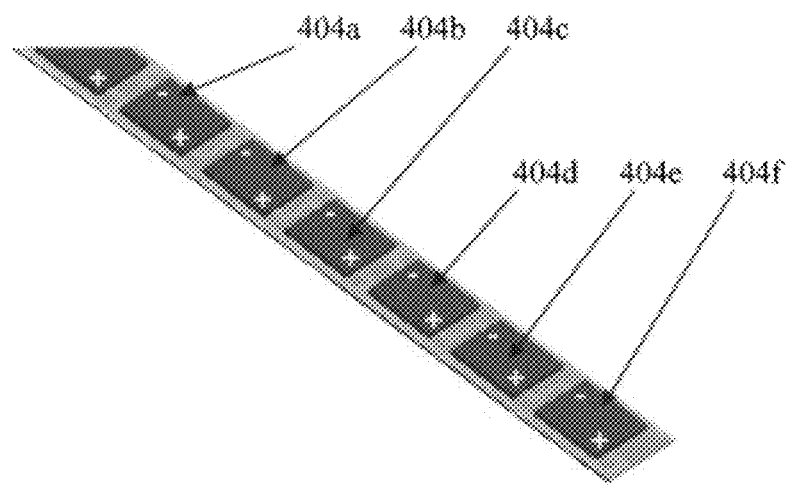
FIG. 4B shows an illustrative schematic of the printed circuit board of FIG. 4A after depositing a plurality of energy storage devices thereon.
Figure 4C:
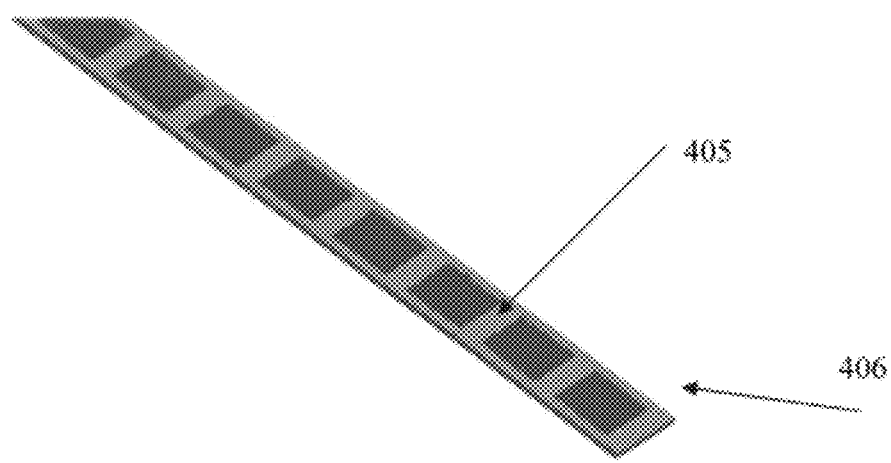
FIG. 4C shows an illustrative schematic of the printed circuit board of FIG. 4B after depositing an insulating layer about the energy storage devices.

In some embodiments, electrical connections between the energy storage devices can be established through electrical connections on a printed circuit board substrate, which serves as a support material for the energy storage layer. FIG. 4A shows an illustrative schematic of a printed circuit board substrate 400 having series electrical connections 401 and parallel electrical connections 402 printed thereon. FIG. 4B shows an illustrative schematic of the printed circuit board substrate of FIG. 4A after depositing a plurality of energy storage devices 404a-404f thereon. As shown in FIGS. 4A and 4B, energy storage devices 404a-404f are connected to one another in parallel, where every three energy storage devices are also connected to one another in series in order to step up the voltage. It should be recognized that the arrangement shown in FIGS. 4A and 4B should be considered illustrative in nature only, and any series/parallel arrangement of the energy storage devices can be used in the present embodiments. Particularly, the connection of every three energy storage device in series should not be considered limiting. FIG. 4C shows an illustrative schematic of the printed circuit board substrate of FIG. 4B after depositing an insulating layer 405 about energy storage devices 404a-404f to form energy storage layer 406.

As previously noted, the energy storage layers can be used in layered composite materials to form an energy storage assembly having good tension/compression stress properties. In such embodiments, the exterior stress carrying layers of the energy storage assemblies can bear tension/compression stress, and the interior energy storage layer(s) can bear shear stress, in addition to conveying electrical storage capabilities.

In some embodiments, at least one stress carrying layer can be in contact with the at least one energy storage layer. In some embodiments, the at least one energy storage layer can be disposed between at least two stress carrying layers. In such embodiments, the energy storage assemblies resemble layered composite 200 depicted in FIG. 2, except that insulating layer 201 is replaced by insulating layer 300 or 302 depicted in FIG. 3A or 3B, respectively, in which energy storage devices are located in the openings therein. In some embodiments, a suitable stress carrying layer can be a fiber reinforced polymer composite.

Figure 5:
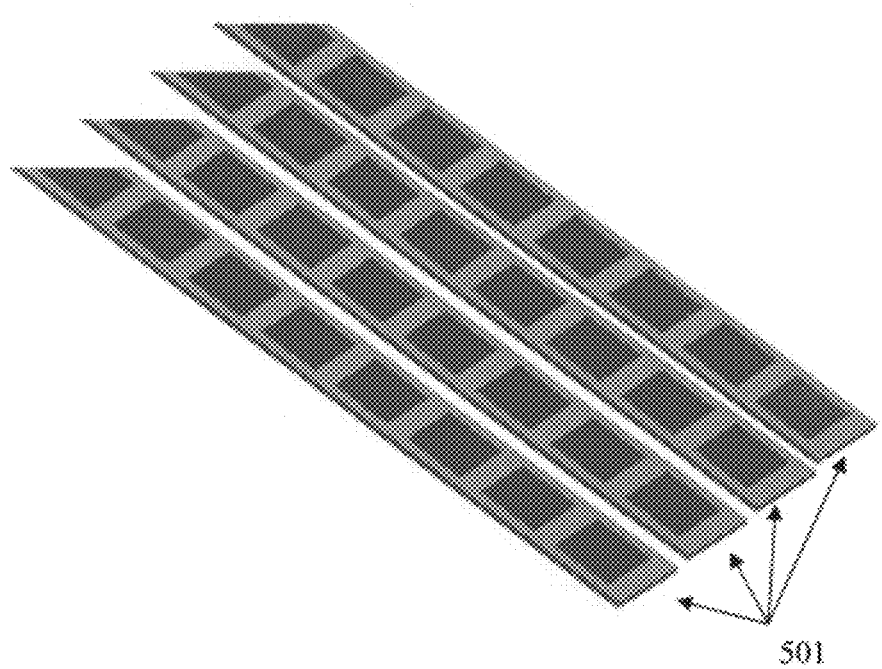
FIG. 5 shows an illustrative schematic of an energy storage assembly having multiple single-row energy storage layers laid alongside one another.

In some embodiments, the present energy storage assemblies can have their plurality of energy storage devices arranged in a grid structure in the at least one energy storage layer. As noted above, the energy storage layer(s) can be constructed such that multiple rows of energy storage devices are contained therein. Alternately, multiple single-row energy storage layers can be laid alongside each other to form a larger energy storage layer within the energy storage assemblies. FIG. 5 shows an illustrative schematic of an energy storage assembly having multiple single-row energy storage layers 501 laid alongside one another. In FIG. 5, the stress carrying layers have not been shown for purposes of clarity.

In some embodiments, the energy storage assemblies can contain multiple energy storage layers stacked upon one another and disposed between two or more stress carrying layers. That is, the energy storage layers can be built up to attain a desired height in an article containing the energy storage assemblies. Likewise, multiple stress carrying layers can be used to achieve a desired thickness or strength.

Since tension/compression stress can be substantially borne by the stress carrying layers in the present energy storage assemblies, the thickness of the at least one energy storage layer can be a significant fraction of the thickness of the energy storage assemblies without comprising their structural integrity. In some embodiments, a thickness of the at least one energy storage layer can be up to about 50% of the thickness of the energy storage assembly. In some embodiments, a thickness of the at least one energy storage layer can be up to about 60% of the thickness of the energy storage assembly. In some embodiments, a thickness of the at least one energy storage layer can be up to about 70% of the thickness of the energy storage assembly. In some embodiments, a thickness of the at least one energy storage layer can be up to about 80% of the thickness of the energy storage assembly. In some embodiments, a thickness of the at least one energy storage layer can be up to about 90% of the thickness of the energy storage assembly.

Figure 6:
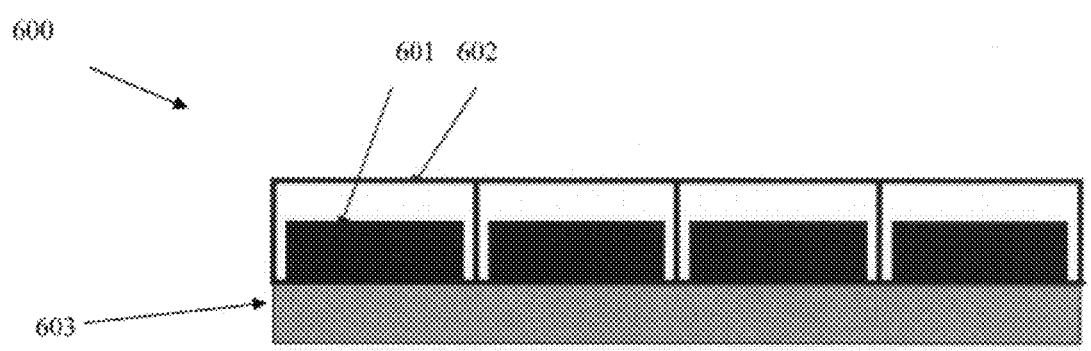
FIG. 6 shows an illustrative side view schematic of an energy storage layer in which energy storage device casings form the insulating layer.

In some alternative embodiments, the insulator layer can be derived from a casing enveloping the energy storage devices. In such embodiments, the casing of the energy storage device can both support and protect the energy storage device, while also providing resistance against shear forces in an energy storage assembly. FIG. 6 shows an illustrative side view schematic of an energy storage layer 600 in which energy storage device casings form the insulating layer. As shown in FIG. 6, energy storage devices 601 protected by casing 602 are butted against one another on support material 603. The resulting energy storage layer 600 resembles a compression watch band, where the individual energy storage devices 601 and their associated casing 602 represent links in the watch band. As will be evident to one having ordinary skill in the art, such an arrangement of the energy storage devices 601 and casings 602 will maintain considerable flexibility, as further provided for by support material 603. It should be pointed out that energy storage layer 600 still contains the energy storage devices 601 in a spaced apart manner, since the associated casings 602 are not part of the energy storage devices themselves. In the embodiment shown in FIG. 6, the energy storage devices 601 are present in a depression within the insulating layer, as defined by casing 602. As shown in FIG. 6, the energy storage devices 601 do not completely fill the void within each casing 602. However, it should be recognized that the energy storage devices 601 can completely or incompletely fill the casings 602, depending on the design of both the energy storage devices and casing.

In some embodiments, energy storage assemblies described herein can contain at least two stress carrying layers and at least one energy storage layer disposed between the at least two stress carrying layers. The at least one energy storage layer can contain a support material, an insulating layer having a plurality of openings arranged in a spaced apart manner, and a plurality of energy storage devices, where each energy storage device is contained within one of the openings.

In some embodiments, methods for forming the present energy storage assemblies are described herein. In some embodiments, the methods can include disposing a plurality of energy storage devices on a support material in a spaced apart manner, and then disposing an insulating layer around the plurality of energy storage devices on the support material to form an energy storage layer. In some embodiments, the methods can further include forming a plurality of electrical connections on the support material, and then electrically connecting the plurality of energy storage devices using the plurality of electrical connections. In alternative embodiments, the methods can involve forming direct electrical connections (e.g., wires and the like) between the energy storage devices.

In some embodiments, the insulating layer of the energy storage layer can be preformed before being placed around the energy storage devices. That is, in such embodiments, the insulating layer can be preformed with a plurality of spaced apart openings that match the spacing of the plurality of energy storage devices on the support material. Patterning of a polymeric or like insulating layer with a plurality of spaced apart openings can be accomplished by a number of fabrication techniques that are well known to one having ordinary skill in the art. After formation of the patterned insulating layer, the insulating layer can be laid around the energy storage devices to form the energy storage layer.

In some embodiments, the present methods can further include placing at least one of the energy storage layers between at least two stress carrying layers. In an embodiment, each stress carrying layer can be a fiber-reinforced polymer composite. In some embodiments, a single energy storage layer can be placed between the stress carrying layers. In other embodiments, multiple single-row energy storage layers can be laid alongside one another when being placed between the stress carrying layers. In still other embodiments, multiple energy storage layers can be stacked upon one another when being placed between the stress carrying layers.

In some embodiments, placing the at least one energy storage layer between the stress carrying layers can involve a laying up process. In some embodiments, such a laying up process can involve simply cutting strips of the energy storage layer to a desired length and then placing a desired number of strips between the stress carrying layers. It should be noted than when cutting the energy storage layers, it can happen that an energy storage device is severed during the cutting process. Although it is not particularly desirable to cut an energy storage device, it is not imperative that all energy storage devices remain functional in order for the energy storage layers to function satisfactorily. That is, the loss of one energy storage device will not significantly degrade the electrical performance.

In some embodiments, placing the at least one energy storage layer between the stress carrying layers can involve a filament winding process. Such processes can involve winding the energy storage layer over a male mould and are known to one having ordinary skill in the art. Filament winding can be used to form energy storage assemblies having a tubular structure such as, for example, a pipe.

In some embodiments, the energy storage devices of the present energy storage assemblies can contain carbon nanotubes. As noted previously, inclusion of carbon nanotubes in energy storage devices can enhance their electrical properties without increasing their weight. The inclusion of carbon nanotubes in the energy storage devices can allow a greater energy density per unit weight to be realized. For example, replacement of carbon black in a traditional lithium-ion battery with carbon nanotubes can allow approximately a 15-25 percent increase in power density to be realized. Replacement of metal electrodes in an energy storage device with carbon nanotube composite materials can allow still greater increases in power density to be attained. By replacement of metal electrodes with carbon nanotube composite materials, significant reductions in weight can also be realized, since electrode materials in traditional batteries and capacitors can make up to about 60% of the gross weight of the cell.

Illustrative but non-limiting examples of carbon nanotube-enhanced energy storage devices include those described in commonly assigned, co-pending U.S. patent application Ser. Nos. 13/039,025 and 13/039,028, each filed on Mar. 2, 2011, and Ser. No. 13/117,071, filed on May 26, 2011, each of which is incorporated herein by reference in its entirety. When incorporated in an energy storage device, the carbon nanotubes can replace any part of the energy storage device. Specifically, the carbon nanotubes can replace activated carbon or electrode materials, in some embodiments. In other embodiments, energy storage devices containing carbon nanotubes that incorporate more non-traditional design paradigms can also be used in the energy storage assemblies of the present disclosure. Further disclosure concerning supercapacitors containing carbon nanotubes is set forth below.

When used in an energy storage device, carbon nanotubes can be employed in any suitable form. In some embodiments, the carbon nanotubes can be dispersed as individual carbon nanotubes. In some embodiments, the carbon nanotubes can be incorporated in the energy storage device in the form of carbon nanotube-infused fibers. Such carbon nanotube-infused fibers are described in commonly assigned, co-pending U.S. patent application Ser. Nos. 12/611,073, 12/611,101, and 12/611,103, all filed on Nov. 2, 2009, and Ser. No. 12/938,328, filed on Nov. 2, 2010, each of which is incorporated herein by reference in its entirety. The fiber material of such carbon nanotube-infused fibers can generally vary without limitation and can include, for example, glass fibers, carbon fibers, metal fibers, ceramic fibers, and organic fibers (e.g., aramid fibers) for example. Such carbon nanotube-infused fibers can be readily prepared in spoolable lengths from commercially available continuous fibers or continuous fiber forms (e.g., fiber tows or fiber tapes). In addition, the carbon nanotubes' lengths, diameters, and coverage density can readily be varied by the above-referenced methods.

Depending on their growth conditions and subsequent processing, the carbon nanotubes of the carbon nanotube-infused fibers can also be oriented such that they are substantially perpendicular to the surface of the fiber material or such that they are substantially parallel to the longitudinal axis of the fiber material. In the present embodiments, by using carbon nanotube-infused fibers having substantially perpendicular carbon nanotubes, a better presentation of the carbon nanotube surface area can be realized (e.g., to an electrolyte). This is particularly true when the carbon nanotubes are present in a substantially unbundled state. The above-referenced methods for preparing carbon nanotube-infused fibers are particularly adept at achieving a substantially perpendicular orientation and a substantially unbundled state, thereby providing carbon nanotube-infused fibers having a high effective surface area for use in the present embodiments. Additional details concerning the carbon nanotube-infused fibers and methods for production thereof are set forth hereinafter.

The types of carbon nanotubes infused to the continuous fibers can generally vary without limitation. In various embodiments, the carbon nanotubes infused to the continuous fibers can be, for example, any of a number of cylindrically-shaped carbon allotropes of the fullerene family including single-wall carbon nanotubes, double-wall carbon nanotubes, multi-wall carbon nanotubes, and any combination thereof. In some embodiments, the carbon nanotubes can be capped with a fullerene-like structure. Stated another way, the carbon nanotubes have closed ends in such embodiments. However, in other embodiments, the carbon nanotubes can remain open-ended. In some embodiments, closed carbon nanotube ends can be opened through treatment with an appropriate oxidizing agent (e.g., $HNO_3/H_2SO_4$). In some embodiments, the carbon nanotubes can encapsulate other materials. In some embodiments, the carbon nanotubes can be covalently functionalized after becoming infused to the fiber material. In some embodiments, a plasma process can be used to promote functionalization of the carbon nanotubes. In some embodiments, the carbon nanotubes can be at least partially coated with another material when infused to the continuous fibers.

Carbon nanotubes can be metallic, semimetallic or semiconducting depending on their chirality. An established system of nomenclature for designating a carbon nanotube's chirality is recognized by one having ordinary skill in the art and is distinguished by a double index (n,m), where n and m are integers that describe the cut and wrapping of hexagonal graphite when formed into a tubular structure. In addition to chirality, a carbon nanotube's diameter also influences its electrical conductivity and the related property of thermal conductivity. In the synthesis of carbon nanotubes, the carbon nanotubes' diameters can be controlled by using catalytic nanoparticles of a given size. Typically, a carbon nanotube's diameter is approximately that of the catalytic nanoparticle that catalyzes its formation. Therefore, carbon nanotubes' properties can be controlled in one respect by adjusting the size of the catalytic nanoparticles used in their synthesis, for example. By way of non-limiting example, catalytic nanoparticles having a diameter of about 1 nm can be used to infuse a fiber material with single-wall carbon nanotubes. Larger catalytic nanoparticles can be used to prepare predominantly multi-wall carbon nanotubes, which have larger diameters because of their multiple nanotube layers, or mixtures of single-wall and multi-wall carbon nanotubes. Multi-wall carbon nanotubes typically have a more complex conductivity profile than do single-wall carbon nanotubes due to interwall reactions that can occur between the individual nanotube layers and redistribute current non-uniformly. By contrast, there is no change in current across different portions of a single-wall carbon nanotube.

In general, the carbon nanotubes infused to the continuous fibers can be of any length. Longer carbon nanotubes are generally more advantageous in the present embodiments, since they can have a higher effective surface area. In various embodiments, the carbon nanotubes can have a length ranging between about 1 μm and about 1000 μm or between about 1 μm and about 500 μm. In some embodiments, the carbon nanotubes can have a length ranging between about 100 μm and about 500 μm. In other embodiments, the carbon nanotubes can have a length ranging between about 1 μm and about 50 μm or between about 10 μm and about 25 μm. In some embodiments, the carbon nanotubes can be substantially uniform in length.

In some embodiments, an average length of the carbon nanotubes can range between about 1 μm and about 500 μm, including about 1 μm, about 2 μm, about 3 μm, about 4 μm, about 5 μm, about 6 μm, about 7 μm, about 8 μm, about 9 μm, about 10 μm, about 15 μm, about 20 μm, about 25 μm, about 30 μm, about 35 μm, about 40 μm, about 45 μm, about 50 μm, about 60 μm, about 70 μm, about 80 μm, about 90 μm, about 100 μm, about 150 μm, about 200 μm, about 250 μm, about 300 μm, about 350 μm, about 400 μm, about 450 μm, about 500 μm, and all values and subranges therebetween. In some embodiments, an average length of the carbon nanotubes can be less than about 1 μm, including about 0.5 μm, for example, and all values and subranges therebetween. In some embodiments, an average length of the carbon nanotubes can range between about 1 μm and about 10 μm, including, for example, about 1 μm, about 2 μm, about 3 μm, about 4 μm, about 5 μm, about 6 μm, about 7 μm, about 8 μm, about 9 μm, about 10 μm, and all values and subranges therebetween. In still other embodiments, an average length of the carbon nanotubes can be greater than about 500 μm, including, for example, about 510 μm, about 520 μm, about 550 μm, about 600 μm, about 700 μm, and all values and subranges therebetween.

The average length of the carbon nanotubes can be one factor that determines the weight percentage of carbon nanotubes infused to the continuous fiber. In general, the carbon nanotube-infused fibers described in the above-referenced, co-pending patent applications have much higher carbon nanotube loading percentages than can be obtained by other methods. For example, carbon nanotube-infused fibers can contain between about 1% to about 30% or even about 40% to about 50% infused carbon nanotubes by weight. In the present embodiments, the chosen carbon nanotube weight percentage can be dictated by a desired electrical property (e.g., a desired capacitance for a supercapacitor).

The carbon nanotube coverage density on the continuous fibers can be another factor that determines the weight percentage of infused carbon nanotubes. In some embodiments, the carbon nanotubes infused to the fiber material are generally uniform in density distribution, referring to the uniformity of the carbon nanotube density that is infused to the fiber material. As defined above, the tolerance for a uniform density distribution is plus or minus about 10% over the fiber material surface area that is infused with carbon nanotubes. By way of non-limiting example, this tolerance is equivalent to about ±1500 carbon nanotubes/μm² for a carbon nanotube having a diameter of 8 nm and 5 walls. Such a figure assumes that the space inside the carbon nanotube is fillable. In some embodiments, the maximum carbon nanotube density, expressed as a percent coverage of the fiber material (i.e., the percentage of the fiber material surface area that is covered with carbon nanotubes) can be as high as about 55%, again assuming a carbon nanotube having an 8 nm diameter, 5 walls and fillable space within. 55% surface area coverage is equivalent to about 15,000 carbon nanotubes/μm² for a carbon nanotube having the referenced dimensions. In some embodiments, the density of coverage is up to about 15,000 carbon nanotubes/μm². One of ordinary skill in the art will recognize that a wide range of carbon nanotube density distributions can be attained by varying the disposition of the catalytic nanoparticles on the surface of the fiber material, the exposure time of the fiber material to carbon nanotube growth conditions, and the actual growth conditions themselves used to infuse the carbon nanotubes to the fiber material.

In some embodiments, the carbon nanotubes grown on a fiber material can be present as individual carbon nanotubes. That is, the carbon nanotubes can be present in a substantially non-bundled state. In some embodiments, the carbon nanotubes grown on the fiber material can be present as a carbon nanostructure containing interlinked carbon nanotubes. In such embodiments, substantially non-bundled carbon nanotubes can be present as an interlinked network of carbon nanotubes. In some embodiments, the interlinked network can contain carbon nanotubes that branch in a dendrimeric fashion from other carbon nanotubes. In some embodiments, the interlinked network can also contain carbon nanotubes that bridge between carbon nanotubes. In some embodiments, the interlinked network can also contain carbon nanotubes that have a least a portion of their sidewalls shared with other carbon nanotubes.

In some embodiments, graphene or other carbon nanomaterials can be grown on a fiber material by appropriate modifications to the growth conditions. Such modifications will be evident to one having ordinary skill in the art. It should be recognized that any embodiment herein referencing carbon nanotubes can also utilize graphene or other carbon nanomaterials while still residing within the spirit and scope of the present disclosure.

In various embodiments, individual continuous fibers (i.e., individual filaments) can have a diameter ranging between about 1 μm and about 100 μm. Continuous length fibers having diameters in this range are readily available from a variety of commercial sources.

In general, the continuous fibers are used in a higher order fiber form in the present embodiments, rather than being used as individual filaments. Such higher order fiber forms vary widely in structure and are considered in further detail immediately hereinafter. In some embodiments, the fiber form of the continuous fibers can be, for example, a fiber tow, a fiber tape, and/or a fiber ribbon. In other embodiments, the fiber form can be, for example, a fiber roving, a yarn, a fiber braid, a woven or non-woven fabric, a fiber ply, and/or a fiber mat.

Rovings include soft strands of continuous fiber that have been twisted, attenuated and freed of foreign matter.

Fiber tows are generally compactly associated bundles of continuous fibers, which can be twisted together to give yarns in some embodiments. Yarns include closely associated bundles of twisted fibers, wherein each fiber diameter in the yarn is relatively uniform. Yarns have varying weights described by their 'tex,' (expressed as weight in grams per 1000 linear meters), or 'denier' (expressed as weight in pounds per 10,000 yards). For yarns, a typical tex range is usually between about 200 and about 2000.

Fiber braids are rope-like structures of densely packed continuous fibers. Such rope-like structures can be assembled from yarns, for example. Braided structures can optionally include a hollow portion. Alternately, a braided structure can be assembled about another core material.

Fiber tows can also include associated bundles of untwisted continuous fibers. Thus, fiber tows are a convenient form for manipulating large quantities of substantially parallel fibers in a single operation. As in yarns, the individual fiber diameters in a fiber tow are generally uniform. Fiber tows also have varying weights and a tex range that is usually between about 200 and 2000. In addition, fiber tows are frequently characterized by the number of thousands of individual fibers in the fiber tow, such as, for example, a 12K tow, a 24K tow, a 48K tow, and the like.

Tapes and ribbons contain continuous fibers that can be assembled as weaves or as non-woven flattened fiber tows, for example. Tapes can vary in width and are generally two-sided structures similar to a ribbon. In a tape or ribbon, carbon nanotubes can be infused on one or both sides thereof. Further, carbon nanotubes of different types, diameters or lengths can be grown on each side of a tape or a ribbon.

In some embodiments, the continuous fibers can be organized into fabric or sheet-like structures. These include, for example, woven fabrics, non-woven fabrics, non-woven fiber mats and fiber plies, in addition to the tapes described above. Such higher ordered structures can be assembled from parent continuous fibers, fiber tows, yarns, or the like.

In supercapacitors containing carbon nanotube-infused fibers, the capacitance is generally at least about 1 Farad/gram of continuous fibers. In some embodiments, the capacitance can range between about 1 Farad/gram and about 100 Farad/gram of continuous fibers. In other embodiments, the capacitance can range between about 1 Farad/gram and about 50 Farad/gram of continuous fibers or between about 1 Farad/gram and about 40 Farad/gram of continuous fibers, including all subranges therebetween.

According to more particular embodiments described herein, the infused carbon nanotubes of an energy storage device can be at least partially covered with a coating. When used in a supercapacitor, such a coating can increase the supercapacitor's capacitance. In certain instances, the increase in capacitance can be an order of magnitude or more (e.g., at least about 10-fold greater) relative to a like supercapacitor lacking the coating on the infused carbon nanotubes. In such embodiments, the capacitance can be at least about 10 Farad/gram of continuous fibers. In some embodiments, supercapacitors having coated carbon nanotubes can have a capacitance ranging between about 10 Farad/gram and about 100 Farad/gram of continuous fibers.

Suitable materials for coating carbon nanotubes in order to increase capacitance of a supercapacitor can include, for example, conducting polymers, main group metal compounds, transition metal compounds, and combinations thereof. In some embodiments, the carbon nanotubes can be completely coated with the coating material. In other embodiments, the carbon nanotubes can be partially coated with the coating material. In some embodiments, a portion of the carbon nanotubes can be completely coated with the coating material and another portion of the carbon nanotubes can remain partially coated or uncoated. In some embodiments, carbon nanotube coatings can include materials such as, for example, polypyrrole, $MnO_2$, $RuO_2$, or various combinations thereof.

When used, the carbon nanotube coating can generally be present in an amount ranging between about 1 percent and about 90 percent by weight of the carbon nanotube-infused fibers. In more particular embodiments, an amount of the carbon nanotube coating can range between about 2.5 percent and about 70 percent, or between about 5 percent and about 50 percent by weight of the carbon nanotube-infused fibers.

When used, a thickness of the carbon nanotube coating can generally range between about 0.0001 microns and about 10 microns. In more particular embodiments, a thickness of the carbon nanotube coating can range between about 0.001 microns and 1 microns, or between about 0.005 microns and about 0.5 microns.

Embodiments disclosed herein utilize carbon nanotube-infused fibers that can be readily prepared by methods described in commonly-owned, co-pending U.S. patent application Ser. Nos. 12/611,073, 12/611,101, 12/611,103, and 12/938,328 each of which is incorporated by reference herein in its entirety. A brief description of the processes described therein follows.

To infuse carbon nanotubes to a fiber material, the carbon nanotubes are synthesized directly on the fiber material. In some embodiments, this is accomplished by first disposing a carbon nanotube-forming catalyst (e.g., catalytic nanoparticles) on the fiber material. A number of preparatory processes can be performed prior to this catalyst deposition.

In some embodiments, the fiber material can be optionally treated with a plasma to prepare the fiber surface to accept the catalyst. For example, a plasma treated glass fiber material can provide a roughened glass fiber surface in which the carbon nanotube-forming catalyst can be deposited. In some embodiments, the plasma also serves to "clean" the fiber surface. The plasma process for "roughing" the fiber surface thus facilitates catalyst deposition. The roughness is typically on the scale of nanometers. In the plasma treatment process craters or depressions are formed that are nanometers deep and nanometers in diameter. Such surface modification can be achieved using a plasma of any one or more of a variety of different gases, including, without limitation, argon, helium, oxygen, ammonia, nitrogen and hydrogen. In addition, the plasma treatment of the fiber surface can add functional groups thereto that can be useful in some embodiments.

In some embodiments, where a fiber material being employed has a sizing material associated with it, such sizing can be optionally removed prior to catalyst deposition. Optionally, the sizing material can be removed after catalyst deposition. In some embodiments, sizing material removal can be accomplished during carbon nanotube synthesis or just prior to carbon nanotube synthesis in a pre-heat step. In other embodiments, some sizing materials can remain throughout the entire carbon nanotube synthesis process.

Yet another optional step prior to or concomitant with deposition of the carbon nanotube-forming catalyst (i.e., catalytic nanoparticles) is application of a barrier coating on the fiber material. Barrier coatings are materials designed to protect the integrity of sensitive fiber materials, such as carbon fibers, organic fibers, glass fibers, metal fibers, and the like. Such a barrier coating can include, for example, an alkoxysilane, an alumoxane, alumina nanoparticles, spin on glass and glass nanoparticles. For example, in an embodiment the barrier coating is Accuglass T-11 Spin-On Glass (Honeywell International Inc., Morristown, N.J.). The carbon nanotube-forming catalyst can be added to the uncured barrier coating material and then applied to the fiber material together, in one embodiment. In other embodiments, the barrier coating material can be added to the fiber material prior to deposition of the carbon nanotube-forming catalyst. In such embodiments, the barrier coating can be partially cured prior to catalyst deposition. The barrier coating material can be of a sufficiently thin thickness to allow exposure of the carbon nanotube-forming catalyst to the carbon feedstock gas for subsequent CVD- or like carbon nanotube growth. In some embodiments, the barrier coating thickness is less than or about equal to the effective diameter of the carbon nanotube-forming catalyst. Once the carbon nanotube-forming catalyst and the barrier coating are in place, the barrier coating can be fully cured. In some embodiments, the thickness of the barrier coating can be greater than the effective diameter of the carbon nanotube-forming catalyst so long as it still permits access of carbon nanotube feedstock gases to the sites of the catalyst. Such barrier coatings can be sufficiently porous to allow access of carbon feedstock gases to the carbon nanotube-forming catalyst.

In some embodiments, the thickness of the barrier coating ranges between about 10 nm and about 100 nm. In other embodiments, the thickness of the barrier coating ranges between about 10 nm and about 50 nm, including 40 nm. In some embodiments, the thickness of the barrier coating is less than about 10 nm, including about 1 nm, about 2 nm, about 3 nm, about 4 nm, about 5 nm, about 6 nm, about 7 nm, about 8 nm, about 9 nm, and about 10 nm, including all values and subranges therebetween.

Without being bound by theory, the barrier coating can serve as an intermediate layer between the fiber material and the carbon nanotubes and mechanically infuses the carbon nanotubes to the fiber material. Such mechanical infusion via a barrier coating provides a robust system for carbon nanotube growth in which the fiber material serves as a platform for organizing the carbon nanotubes, while still allowing the beneficial carbon nanotube properties to be conveyed to the fiber material. Moreover, benefits of including a barrier coating can include, for example, protection of the fiber material from chemical damage due to moisture exposure and/or thermal damage at the elevated temperatures used to promote carbon nanotube growth.

As described further below, the carbon nanotube-forming catalyst can be prepared as a liquid solution that contains the carbon nanotube-forming catalyst as transition metal catalytic nanoparticles. The diameters of the synthesized carbon nanotubes are related to the size of the transition metal catalytic nanoparticles as described above.

Carbon nanotube synthesis can be based on a chemical vapor deposition (CVD) process or related carbon nanotube growth process which occurs at elevated temperatures. In some embodiments, the CVD-based growth process can be plasma-enhanced by providing an electric field during the growth process such that the carbon nanotube growth follows the direction of the electric field. Other illustrative carbon nanotube growth processes include, for example, micro-cavity, laser ablation, flame synthesis, arc discharge, and high pressure carbon monoxide (HiPCO) synthesis. The specific temperature is a function of catalyst choice, but can typically be in a range of about 500° C. to about 1000° C. Accordingly, carbon nanotube synthesis involves heating the fiber material to a temperature in the aforementioned range to support carbon nanotube growth.

In some embodiments, CVD-promoted carbon nanotube growth on the catalyst-laden fiber material is performed. The CVD process can be promoted by, for example, a carbon-containing feedstock gas such as acetylene, ethylene, and/or methane. The carbon nanotube growth processes also generally use an inert gas (e.g., nitrogen, argon, and/or helium) as a primary carrier gas. The carbon-containing feedstock gas is typically provided in a range from between about 0% to about 15% of the total mixture. A substantially inert environment for CVD growth can be prepared by removal of moisture and oxygen from the growth chamber.

In the carbon nanotube growth process, carbon nanotubes grow at the sites of transition metal catalytic nanoparticles that are operable for carbon nanotube growth. The presence of a strong plasma-creating electric field can be optionally employed to affect carbon nanotube growth. That is, the growth tends to follow the direction of the electric field. By properly adjusting the geometry of the plasma spray and electric field, vertically aligned carbon nanotubes (i.e., perpendicular to the surface of the fiber material) can be synthesized. Under certain conditions, even in the absence of a plasma, closely-spaced carbon nanotubes can maintain a substantially vertical growth direction resulting in a dense array of carbon nanotubes resembling a carpet or forest. In some embodiments, an interlinked carbon nanotube network can be produced.

Returning to the catalyst deposition process, a carbon nanotube-forming catalyst is deposited to provide a layer (typically no more than a monolayer) of catalytic nanoparticles on the fiber material for the purpose of growing carbon nanotubes thereon. The operation of depositing catalytic nanoparticles on the fiber material can be accomplished by a number of techniques including, for example, spraying or dip coating a solution of catalytic nanoparticles or by gas phase deposition, which can occur by a plasma process. Thus, in some embodiments, after forming a catalyst solution in a solvent, the catalyst can be applied by spraying or dip coating the fiber material with the solution, or combinations of spraying and dip coating. Either technique, used alone or in combination, can be employed once, twice, thrice, four times, up to any number of times to provide a fiber material that is sufficiently uniformly coated with catalytic nanoparticles that are operable for formation of carbon nanotubes. When dip coating is employed, for example, a fiber material can be placed in a first dip bath for a first residence time in the first dip bath. When employing a second dip bath, the fiber material can be placed in the second dip bath for a second residence time. For example, fiber materials can be subjected to a solution of carbon nanotube-forming catalyst for between about 3 seconds to about 90 seconds depending on the dip configuration and linespeed. Employing spraying or dip coating processes, a fiber material with a catalyst surface density of less than about 5% surface coverage to as high as about 80% surface coverage can be obtained. At higher surface densities (e.g., about 80%), the carbon nanotube-forming catalyst nanoparticles are nearly a monolayer. In some embodiments, the process of coating the carbon nanotube-forming catalyst on the fiber material produces no more than a monolayer. For example, carbon nanotube growth on a stack of carbon nanotube-forming catalyst can erode the degree of infusion of the carbon nanotubes to the fiber material. In other embodiments, transition metal catalytic nanoparticles can be deposited on the fiber material using evaporation techniques, electrolytic deposition techniques, and other processes known to those of ordinary skill in the art, such as addition of the transition metal catalyst to a plasma feedstock gas as a metal organic, metal salt or other composition promoting gas phase transport.

Because processes to manufacture carbon nanotube-infused fibers are designed to be continuous, a spoolable fiber material can be dip-coated in a series of baths where dip coating baths are spatially separated. In a continuous process in which nascent fibers are being generated de novo, such as newly formed glass fibers from a furnace, dip bath or spraying of a carbon nanotube-forming catalyst can be the first step after sufficiently cooling the newly formed fiber material. In some embodiments, cooling of newly formed glass fibers can be accomplished with a cooling jet of water which has the carbon nanotube-forming catalyst particles dispersed therein.

In some embodiments, application of a carbon nanotube-forming catalyst can be performed in lieu of application of a sizing when generating a fiber and infusing it with carbon nanotubes in a continuous process. In other embodiments, the carbon nanotube-forming catalyst can be applied to newly formed fiber materials in the presence of other sizing agents. Such simultaneous application of a carbon nanotube-forming catalyst and other sizing agents can provide the carbon nanotube-forming catalyst in surface contact with the fiber material to insure carbon nanotube infusion. In yet further embodiments, the carbon nanotube-forming catalyst can be applied to nascent fibers by spray or dip coating while the fiber material is in a sufficiently softened state, for example, near or below the annealing temperature, such that the carbon nanotube-forming catalyst is slightly embedded in the surface of the fiber material. When depositing the carbon nanotube-forming catalyst on hot glass fiber materials, for example, care should be given to not exceed the melting point of the carbon nanotube-forming catalyst, thereby causing nanoparticle fusion and loss of control of the carbon nanotube characteristics (e.g., diameter) as a result.

Carbon nanotubes infused to a fiber material can serve to protect the fiber material from conditions including, for example, moisture, oxidation, abrasion, compression and/or other environmental conditions. In this case, the carbon nanotubes themselves can act as a sizing agent. Such a carbon nanotube-based sizing agent can be applied to a fiber material in lieu of or in addition to conventional sizing agents. When present, conventional sizing agents can be applied before or after the infusion and growth of carbon nanotubes on the fiber material. Conventional sizing agents vary widely in type and function and include, for example, surfactants, anti-static agents, lubricants, siloxanes, alkoxysilanes, aminosilanes, silanes, silanols, polyvinyl alcohol, starch, and mixtures thereof. Such conventional sizing agents can be used to protect the carbon nanotubes themselves from various conditions or to convey further properties to the fiber material that are not imparted by the carbon nanotubes. In some embodiments, a conventional sizing agent can be removed from the fiber material prior to carbon nanotube growth. Optionally, a conventional sizing agent can be replaced with another conventional sizing agent that is more compatible with the carbon nanotubes or the carbon nanotube growth conditions.

The carbon nanotube-forming catalyst solution can be a transition metal nanoparticle solution of any d-block transition metal. In addition, the nanoparticles can include alloys and non-alloy mixtures of d-block metals in elemental form, in salt form, and mixtures thereof. Such salt forms include, without limitation, oxides, carbides, nitrides, nitrates, sulfides, sulfates, phosphates, halides (e.g., fluorides, chlorides, bromides, and iodides), acetates, citrates and the like. Non-limiting illustrative transition metal nanoparticles include, for example, Ni, Fe, Co, Mo, Cu, Pt, Au, and Ag, salts thereof and mixtures thereof. Many transition metal nanoparticle catalysts are readily commercially available from a variety of suppliers, including, for example, Ferrotec Corporation (Bedford, N.H.).

Catalyst solutions used for applying the carbon nanotube-forming catalyst to the fiber material can be in any common solvent that allows the carbon nanotube-forming catalyst to be uniformly dispersed throughout. Such solvents can include, without limitation, water, acetone, hexane, isopropyl alcohol, toluene, ethanol, methanol, tetrahydrofuran (THF), cyclohexane or any other solvent with controlled polarity to create an appropriate dispersion of the carbon nanotube-forming catalytic nanoparticles therein. Concentrations of carbon nanotube-forming catalyst in the catalyst solution can be in a range from about 1:1 to about 1:10,000 catalyst to solvent.

In some embodiments, after applying the carbon nanotube-forming catalyst to the fiber material, the fiber material can be optionally heated to a softening temperature. This step can aid in embedding the carbon nanotube-forming catalyst in the surface of the fiber material to encourage seeded growth and prevent tip growth where the catalyst floats at the tip of the leading edge a growing carbon nanotube. In some embodiments heating of the fiber material after disposing the carbon nanotube-forming catalyst on the fiber material can be at a temperature between about 500° C. and about 1000° C. Heating to such temperatures, which can be used for carbon nanotube growth, can serve to remove any pre-existing sizing agents on the fiber material allowing deposition of the carbon nanotube-forming catalyst directly on the fiber material. In some embodiments, the carbon nanotube-forming catalyst can also be placed on the surface of a sizing coating prior to heating. The heating step can be used to remove sizing material while leaving the carbon nanotube-forming catalyst disposed on the surface of the fiber material. Heating at these temperatures can be performed prior to or substantially simultaneously with introduction of a carbon-containing feedstock gas for carbon nanotube growth.

In some embodiments, the process of infusing carbon nanotubes to a fiber material can include removing sizing agents from the fiber material, applying a carbon nanotube-forming catalyst to the fiber material after sizing removal, heating the fiber material to at least about 500° C., and synthesizing carbon nanotubes on the fiber material. In some embodiments, operations of the carbon nanotube infusion process can include removing sizing from a fiber material, applying a carbon nanotube-forming catalyst to the fiber material, heating the fiber material to a temperature operable for carbon nanotube synthesis and spraying a carbon plasma onto the catalyst-laden fiber material. Thus, where commercial fiber materials are employed, processes for constructing carbon nanotube-infused fibers can include a discrete step of removing sizing from the fiber material before disposing the catalytic nanoparticles on the fiber material. Some commercial sizing materials, if present, can prevent surface contact of the carbon nanotube-forming catalyst with the fiber material and inhibit carbon nanotube infusion to the fiber material. In some embodiments, where sizing removal is assured under carbon nanotube growth conditions, sizing removal can be performed after deposition of the carbon nanotube-forming catalyst but just prior to or during providing a carbon-containing feedstock gas.

The step of synthesizing carbon nanotubes can include numerous techniques for forming carbon nanotubes, including, without limitation, micro-cavity, thermal or plasma-enhanced CVD techniques, laser ablation, arc discharge, flame synthesis, and high pressure carbon monoxide (HiPCO). During CVD, in particular, a sized fiber material with carbon nanotube-forming catalyst disposed thereon, can be used directly. In some embodiments, any conventional sizing agents can be removed during carbon nanotube synthesis. In some embodiments other sizing agents are not removed, but do not hinder carbon nanotube synthesis and infusion to the fiber material due to the diffusion of the carbon-containing feedstock gas through the sizing. In some embodiments, acetylene gas can be ionized to create a jet of cold carbon plasma for carbon nanotube synthesis. The plasma is directed toward the catalyst-laden fiber material. Thus, in some embodiments synthesizing carbon nanotubes on a fiber material can include (a) forming a carbon plasma; and (b) directing the carbon plasma onto the catalyst disposed on the fiber material. The diameters of the carbon nanotubes that are grown are dictated by the size of the carbon nanotube-forming catalyst. In some embodiments, a sized fiber material can be heated to between about 550° C. and about 800° C. to facilitate carbon nanotube growth. To initiate the growth of carbon nanotubes, two or more gases are bled into the reactor: an inert carrier gas (e.g., argon, helium, or nitrogen) and a carbon-containing feedstock gas (e.g., acetylene, ethylene, ethanol or methane). Carbon nanotubes grow at the sites of the carbon nanotube-forming catalyst.

In some embodiments, a CVD growth process can be plasma-enhanced. A plasma can be generated by providing an electric field during the growth process. Carbon nanotubes grown under these conditions can follow the direction of the electric field. Thus, by adjusting the geometry of the reactor, vertically aligned carbon nanotubes can be grown where the carbon nanotubes are substantially perpendicular to the surface of the fiber material (i.e., radial growth). In some embodiments, a plasma is not required for radial growth to occur about the fiber material. For fiber materials that have distinct sides such as, for example, tapes, mats, fabrics, plies, and the like, the carbon nanotube-forming catalyst can be disposed on one or both sides of the fiber material. Correspondingly, under such conditions, carbon nanotubes can be grown on one or both sides of the fiber material as well.

As described above, the carbon nanotube synthesis is performed at a rate sufficient to provide a continuous process for infusing spoolable length fiber materials with carbon nanotubes. Numerous apparatus configurations facilitate such a continuous synthesis as exemplified below.

In some embodiments, carbon nanotube-infused fiber materials can be prepared in an "all-plasma" process. In such embodiments, the fiber materials pass through numerous plasma-mediated steps to form the final carbon nanotube-infused fiber materials. The first of the plasma processes, can include a step of fiber surface modification. This is a plasma process for "roughing" the surface of the fiber material to facilitate catalyst deposition, as described above. Optionally, a functionalization of the fiber material can also be involved. As also described above, surface modification can be achieved using a plasma of any one or more of a variety of different gases, including, without limitation, argon, helium, oxygen, ammonia, hydrogen, and nitrogen.

After surface modification, the fiber material proceeds to catalyst application. In the present all-plasma process, this step is a plasma process for depositing the carbon nanotube-forming catalyst on the fiber material. The carbon nanotube-forming catalyst is typically a transition metal as described above. The transition metal catalyst can be added to a plasma feedstock gas as a precursor in non-limiting forms including, for example, a ferrofluid, a metal organic, a metal salt, mixtures thereof or any other composition suitable for promoting gas phase transport. The carbon nanotube-forming catalyst can be applied at room temperature in ambient environment with neither vacuum nor an inert atmosphere being required. In some embodiments, the fiber material can be cooled prior to catalyst application.

Continuing the all-plasma process, carbon nanotube synthesis occurs in a carbon nanotube-growth reactor. Carbon nanotube growth can be achieved through the use of plasma-enhanced chemical vapor deposition, wherein carbon plasma is sprayed onto the catalyst-laden fibers. Since carbon nanotube growth occurs at elevated temperatures (typically in a range of about 500° C. to about 1000° C. depending on the catalyst), the catalyst-laden fibers can be heated prior to being exposed to the carbon plasma. For the carbon nanotube infusion process, the fiber material can be optionally heated until softening occurs. After heating, the fiber material is ready to receive the carbon plasma. The carbon plasma can be generated, for example, by passing a carbon-containing feedstock gas such as, for example, acetylene, ethylene, ethanol, and the like, through an electric field that is capable of ionizing the gas. This cold carbon plasma is directed, via spray nozzles, to the fiber material. The fiber material can be in close proximity to the spray nozzles, such as within about 1 centimeter of the spray nozzles, to receive the plasma. In some embodiments, heaters can be disposed above the fiber material at the plasma sprayers to maintain the elevated temperature of the fiber material.

Another configuration for continuous carbon nanotube synthesis involves a special rectangular reactor for the synthesis and growth of carbon nanotubes directly on fiber materials. The reactor can be designed for use in a continuous in-line process for producing carbon nanotube-infused fiber materials. In some embodiments, carbon nanotubes are grown via a CVD process at atmospheric pressure and an elevated temperature in the range of about 550° C. and about 800° C. in a multi-zone reactor. The fact that the carbon nanotube synthesis occurs at atmospheric pressure is one factor that facilitates the incorporation of the reactor into a continuous processing line for carbon nanotube infusion to the fiber materials. Another advantage consistent with in-line continuous processing using such a zone reactor is that carbon nanotube growth occurs in seconds, as opposed to minutes (or longer), as in other procedures and apparatus configurations typical in the art.

Carbon nanotube synthesis reactors in accordance with the various embodiments include the following features:

Rectangular Configured Synthesis Reactors:

The cross-section of a typical carbon nanotube synthesis reactor known in the art is circular. There are a number of reasons for this including, for example, historical reasons (e.g., cylindrical reactors are often used in laboratories) and convenience (e.g., flow dynamics are easy to model in cylindrical reactors, heater systems readily accept circular tubes (e.g., quartz, etc.), and ease of manufacturing. Departing from the cylindrical convention, the present disclosure provides a carbon nanotube synthesis reactor having a rectangular cross section. The reasons for the departure include at least the following:

1) Inefficient Use of Reactor Volume. Since many fiber materials that can be processed by the reactor are relatively planar (e.g., flat tapes, sheet-like forms, or spread tows or rovings), a circular cross-section is an inefficient use of the reactor volume. This inefficiency results in several drawbacks for cylindrical carbon nanotube synthesis reactors including, for example, a) maintaining a sufficient system purge; increased reactor volume requires increased gas flow rates to maintain the same level of gas purge, resulting in inefficiencies for high volume production of carbon nanotubes in an open environment; b) increased carbon-containing feedstock gas flow rates; the relative increase in inert gas flow for system purge, as per a) above, requires increased carbon-containing feedstock gas flow rates. Consider that the volume of an illustrative 12K glass fiber roving is about 2000 times less than the total volume of a synthesis reactor having a rectangular cross-section. In an equivalent cylindrical reactor (i.e., a cylindrical reactor that has a width that accommodates the same planarized glass fiber material as the rectangular cross-section reactor), the volume of the glass fiber material is about 17,500 times less than the volume of the reactor. Although gas deposition processes, such as CVD, are typically governed by pressure and temperature alone, volume can have a significant impact on the efficiency of deposition. With a rectangular reactor there is a still excess volume, and this excess volume facilitates unwanted reactions. However, a cylindrical reactor has about eight times that volume available for facilitating unwanted reactions. Due to this greater opportunity for competing reactions to occur, the desired reactions effectively occur more slowly in a cylindrical reactor. Such a slow down in carbon nanotube growth, is problematic for the development of continuous growth processes. Another benefit of a rectangular reactor configuration is that the reactor volume can be decreased further still by using a small height for the rectangular chamber to make the volume ratio better and the reactions even more efficient. In some embodiments disclosed herein, the total volume of a rectangular synthesis reactor is no more than about 3000 times greater than the total volume of a fiber material being passed through the synthesis reactor. In some further embodiments, the total volume of the rectangular synthesis reactor is no more than about 4000 times greater than the total volume of the fiber material being passed through the synthesis reactor. In some still further embodiments, the total volume of the rectangular synthesis reactor is less than about 10,000 times greater than the total volume of the fiber material being passed through the synthesis reactor. Additionally, it is notable that when using a cylindrical reactor, more carbon-containing feedstock gas is required to provide the same flow percent as compared to reactors having a rectangular cross section. It should be appreciated that in some other embodiments, the synthesis reactor has a cross-section that is described by polygonal forms that are not rectangular, but are relatively similar thereto and provide a similar reduction in reactor volume relative to a reactor having a circular cross section; and c) problematic temperature distribution; when a relatively small-diameter reactor is used, the temperature gradient from the center of the chamber to the walls thereof is minimal, but with increased reactor size, such as would be used for commercial-scale production, such temperature gradients increase. Temperature gradients result in product quality variations across the fiber material (i.e., product quality varies as a function of radial position). This problem is substantially avoided when using a reactor having a rectangular cross-section. In particular, when a planar substrate is used, reactor height can be maintained constant as the size of the substrate scales upward. Temperature gradients between the top and bottom of the reactor are essentially negligible and, as a consequence, thermal issues and the product-quality variations that result are avoided.

2) Gas introduction. Because tubular furnaces are normally employed in the art, typical carbon nanotube synthesis reactors introduce gas at one end and draw it through the reactor to the other end. In some embodiments disclosed herein, gas can be introduced at the center of the reactor or within a target growth zone, symmetrically, either through the sides or through the top and bottom plates of the reactor. This improves the overall carbon nanotube growth rate because the incoming feedstock gas is continuously replenishing at the hottest portion of the system, which is where carbon nanotube growth is most active.

Zoning.

Chambers that provide a relatively cool purge zone extend from both ends of the rectangular synthesis reactor. Applicants have determined that if a hot gas were to mix with the external environment (i.e., outside of the rectangular reactor), there would be increased degradation of the fiber material. The cool purge zones provide a buffer between the internal system and external environments. Carbon nanotube synthesis reactor configurations known in the art typically require that the substrate is carefully (and slowly) cooled. The cool purge zone at the exit of the present rectangular carbon nanotube growth reactor achieves the cooling in a short period of time, as required for continuous in-line processing.

Non-Contact, Hot-Walled, Metallic Reactor.

In some embodiments, a metallic hot-walled reactor (e.g., stainless steel) is employed. Use of this type of reactor can appear counterintuitive because metal, and stainless steel in particular, is more susceptible to carbon deposition (i.e., soot and by-product formation). Thus, most carbon nanotube synthesis reactors are made from quartz because there is less carbon deposited, quartz is easier to clean, and quartz facilitates sample observation. However, Applicants have observed that the increased soot and carbon deposition on stainless steel results in more consistent, efficient, faster, and stable carbon nanotube growth. Without being bound by theory it has been indicated that, in conjunction with atmospheric operation, the CVD process occurring in the reactor is diffusion limited. That is, the carbon nanotube-forming catalyst is "overfed;" too much carbon is available in the reactor system due to its relatively higher partial pressure (than if the reactor was operating under partial vacuum). As a consequence, in an open system—especially a clean one—too much carbon can adhere to the particles of carbon nanotube-forming catalyst, compromising their ability to synthesize carbon nanotubes. In some embodiments, the rectangular reactor is intentionally run when the reactor is "dirty," that is with soot deposited on the metallic reactor walls. Once carbon deposits to a monolayer on the walls of the reactor, carbon will readily deposit over itself. Since some of the available carbon is "withdrawn" due to this mechanism, the remaining carbon feedstock, in the form of radicals, reacts with the carbon nanotube-forming catalyst at a rate that does not poison the catalyst. Existing systems run "cleanly" which, if they were open for continuous processing, would produce a much lower yield of carbon nanotubes at reduced growth rates.

Although it is generally beneficial to perform carbon nanotube synthesis "dirty" as described above, certain portions of the apparatus (e.g., gas manifolds and inlets) can nonetheless negatively impact the carbon nanotube growth process when soot creates blockages. In order to combat this problem, such areas of the carbon nanotube growth reaction chamber can be protected with soot inhibiting coatings such as, for example, silica, alumina, or MgO. In practice, these portions of the apparatus can be dip-coated in these soot inhibiting coatings. Metals such as INVAR® can be used with these coatings as INVAR has a similar CTE (coefficient of thermal expansion) ensuring proper adhesion of the coating at higher temperatures, preventing the soot from significantly building up in critical zones.

Combined Catalyst Reduction and Carbon Nanotube Synthesis.

In the carbon nanotube synthesis reactor disclosed herein, both catalyst reduction and carbon nanotube growth occur within the reactor. This is significant because the reduction step cannot be accomplished timely enough for use in a continuous process if performed as a discrete operation. In a typical process known in the art, a reduction step typically takes 1-12 hours to perform. Both operations occur in a reactor in accordance with the present disclosure due, at least in part, to the fact that carbon-containing feedstock gas is introduced at the center of the reactor, not the end as would be typical in the art using cylindrical reactors. The reduction process occurs as the fiber material enters the heated zone. By this point, the gas has had time to react with the walls and cool off prior to reducing the catalyst (via hydrogen radical interactions). It is this transition region where the reduction occurs. At the hottest isothermal zone in the system, carbon nanotube growth occurs, with the greatest growth rate occurring proximal to the gas inlets near the center of the reactor.

In some embodiments, when loosely affiliated fiber materials including, for example, tows or rovings are employed (e.g., a glass roving), the continuous process can include steps that spread out the strands and/or filaments of the tow or roving. Thus, as a tow or roving is unspooled it can be spread using a vacuum-based fiber spreading system, for example. When employing sized glass fiber rovings, for example, which can be relatively stiff, additional heating can be employed in order to "soften" the roving to facilitate fiber spreading. The spread fibers which contain individual filaments can be spread apart sufficiently to expose an entire surface area of the filaments, thus allowing the roving to more efficiently react in subsequent process steps. For example, a spread tow or roving can pass through a surface treatment step that is composed of a plasma system as described above. The roughened, spread fibers then can pass through a carbon nanotube-forming catalyst dip bath. The result is fibers of the glass roving that have catalyst particles distributed radially on their surface. The catalyzed-laden fibers of the roving then enter an appropriate carbon nanotube growth chamber, such as the rectangular chamber described above, where a flow through atmospheric pressure CVD or plasma enhanced-CVD process is used to synthesize carbon nanotubes at rates as high as several microns per second. The fibers of the roving, now having radially aligned carbon nanotubes, exit the carbon nanotube growth reactor.

It is understood that modifications which do not substantially affect the activity of the various embodiments of this invention are also included within the definition of the invention provided herein. Although the invention has been described with reference to the disclosed embodiments, those of ordinary skill in the art will readily appreciate that these embodiments are only illustrative of the invention. It should be understood that various modifications can be made without departing from the spirit of the invention. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range is specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is the following:

1. An energy storage assembly comprising:
   at least one energy storage layer comprising:
      an insulating layer having a plurality of openings arranged in a spaced apart manner;
      a plurality of energy storage devices, each energy storage device being contained within one of said openings, wherein at least some of the energy storage devices contain carbon nanotube-infused fibers; and
      a support material upon which the plurality of energy storage devices is disposed,
      wherein the plurality of energy storage devices are electrically connected to one another through electrical connections on the support material.

2. The energy storage assembly of claim 1, wherein the insulating layer is disposed on the support material.

3. The energy storage assembly of claim 1, wherein at least some of the energy storage devices are electrically connected to one another in parallel.

4. The energy storage assembly of claim 3, wherein at least some of the energy storage devices are electrically connected to one another in series.

5. The energy storage assembly of claim 1, wherein the insulating layer comprises a material selected from the group consisting of a polymer and a fiber-reinforced polymer composite.

6. The energy storage assembly of claim 1, wherein at least some of the energy storage devices comprise batteries.

7. The energy storage assembly of claim 1, wherein at least some of the energy storage devices comprise capacitors or supercapacitors.

8. The energy storage assembly of claim 1, wherein at least some of the energy storage devices contain carbon nanotubes.

9. The energy storage assembly of claim 1, wherein carbon nanotubes of the carbon-nanotube infused fibers are at least partially covered with a coating selected from the group consisting of polypyrrole, $MnO_2$, $RuO_2$, and combinations thereof.

10. The energy storage assembly of claim 1, further comprising:
    at least one stress carrying layer in contact with the at least one energy storage layer.

11. The energy storage assembly of claim 10, wherein the at least one energy storage layer is disposed between at least two stress carrying layers.

12. The energy storage assembly of claim 11, wherein the at least two stress carrying layers each comprise a fiber-reinforced polymer composite.

13. The energy storage assembly of claim 1, wherein the plurality of energy storage devices are arranged in a grid structure in the at least one energy storage layer.

14. The energy storage assembly of claim 1, wherein a height of the insulating layer is at least that of the energy storage devices.

15. An energy storage assembly comprising:
    at least two stress carrying layers; and
    at least one energy storage layer disposed between the at least two stress carrying layers, the at least one energy storage layer comprising:
      a support material;
      an insulating layer having a plurality of openings arranged in a spaced apart manner; and
      a plurality of energy storage devices disposed on the support material, the plurality of energy storage devices being electrically connected to one another through electrical connections on the support material, each energy storage device being contained within one of said openings, wherein at least some of the energy storage devices contain carbon nanotube-infused fibers.

16. The energy storage assembly of claim 15, wherein the at least one energy storage layer comprises up to about 90% of a thickness of the energy storage assembly.

17. The energy storage assembly of claim 15, wherein the insulating layer comprises a material selected from the group consisting of a polymer and a fiber-reinforced polymer composite.

18. The energy storage assembly of claim 15, wherein each energy storage device is enveloped with a casing; and
wherein the casing comprises the insulating layer.

19. The energy storage assembly of claim 15, wherein each of said openings comprise a hole in the insulating layer.

20. The energy storage assembly of claim 15, wherein at least some of the energy storage devices comprise batteries.

21. The energy storage assembly of claim 15, wherein at least some of the energy storage devices comprise capacitors or supercapacitors.

22. The energy storage assembly of claim 15, wherein at least some of the energy storage devices contain carbon nanotubes.

23. The energy storage assembly of claim 15, wherein the plurality of energy storage devices are arranged in a grid structure in the at least one energy storage layer.

24. The energy storage assembly of claim 1, wherein:
the support material comprises a layer of material upon which the plurality of energy storage devices is disposed, and
each of the plurality of energy storage devices is in contact with the layer of support material.

25. The energy storage assembly of claim 1, wherein the plurality of storage devices are electrically connected to one another through electrical connections printed on the layer of material.

* * * * *